United States Patent
Yoda et al.

(10) Patent No.: US 6,797,536 B2
(45) Date of Patent: Sep. 28, 2004

(54) MAGNETIC MEMORY DEVICE HAVING YOKE LAYER, AND MANUFACTURING METHOD

(75) Inventors: Hiroaki Yoda, Kawasaki (JP); Yoshiaki Asao, Yokohama (JP); Tomomasa Ueda, Yokohama (JP); Minoru Amano, Kawasaki (JP); Tatsuya Kishi, Yokohama (JP); Keiji Hosotani, Tokyo (JP); Junichi Miyamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/767,997

(22) Filed: Feb. 2, 2004

(65) Prior Publication Data

US 2004/0152227 A1 Aug. 5, 2004

Related U.S. Application Data

(62) Division of application No. 10/379,656, filed on Mar. 6, 2003.

(30) Foreign Application Priority Data

Jul. 30, 2002 (JP) .......................................... 2002-221877
Nov. 7, 2002 (JP) .......................................... 2002-324105

(51) Int. Cl.[7] .............................................. H01L 21/00
(52) U.S. Cl. .............................................. 438/48; 438/3
(58) Field of Search .............................. 438/48, 3, 52, 438/57, 73, 189, 195, 283

(56) References Cited

U.S. PATENT DOCUMENTS

| | | | | | |
|---|---|---|---|---|---|
| 6,165,607 | A | * | 12/2000 | Yamanobe et al. | .......... 428/332 |
| 6,201,259 | B1 | | 3/2001 | Sato et al. | |
| 6,548,849 | B1 | | 4/2003 | Pan et al. | |

* cited by examiner

Primary Examiner—David Nelms
Assistant Examiner—Thinh T Nguyen
(74) Attorney, Agent, or Firm—Oblon, Spivak, McClelland, Maier & Neustadt, PC

(57) ABSTRACT

A magnetic memory device includes first wiring which runs in the first direction, second wiring which runs in the second direction, a magneto-resistance element which is arranged at an intersection between the first and second wirings, a first yoke main body which covers at least either of the lower surface and two side surfaces of the first wring, a second yoke main body which covers at least either of the upper surface and two side surfaces of the second wiring, first and second yoke tips which are arranged on two sides of the magneto-resistance element in the first direction at an interval from the magneto-resistance element, and third and fourth yoke tips which are arranged on two sides of the magneto-resistance element in the second direction at an interval from the magneto-resistance element.

26 Claims, 35 Drawing Sheets

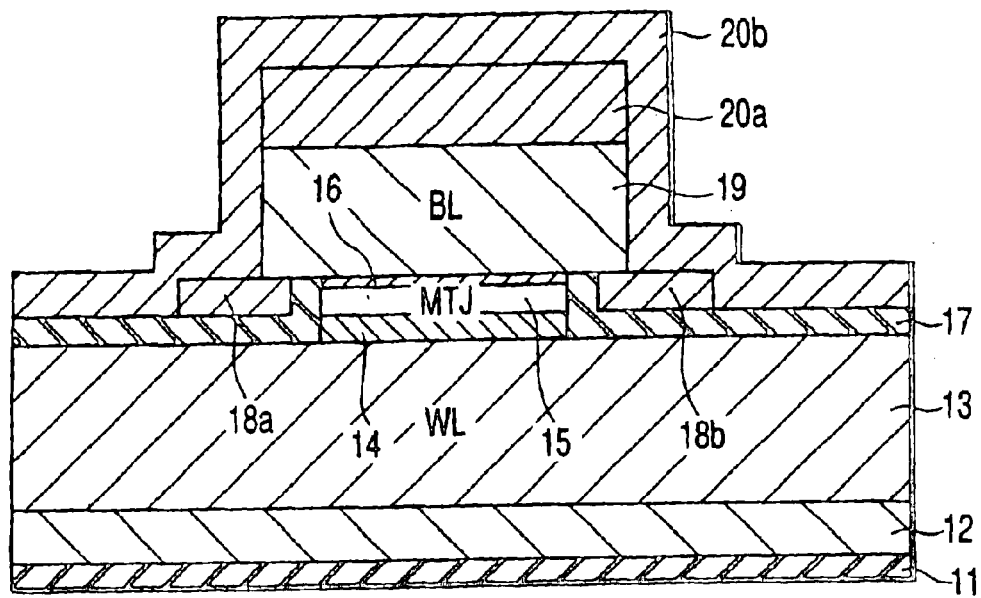
F I G. 8
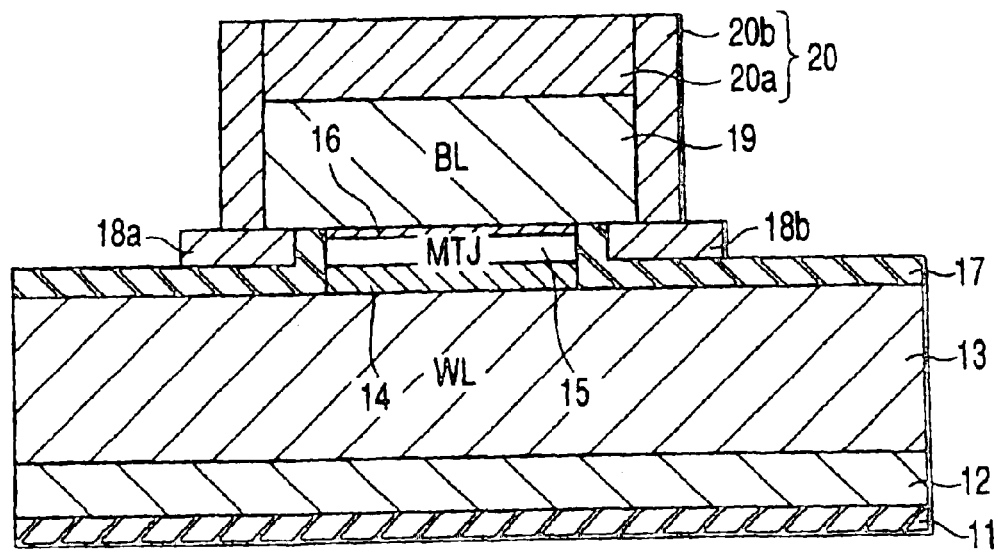
F I G. 9

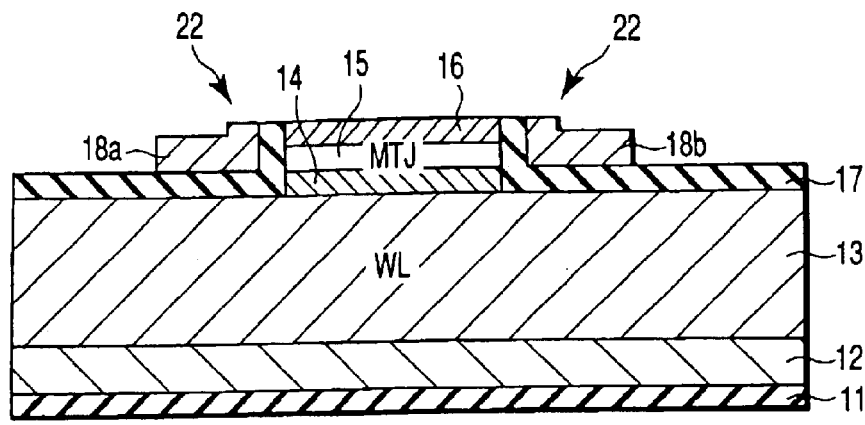
FIG. 13
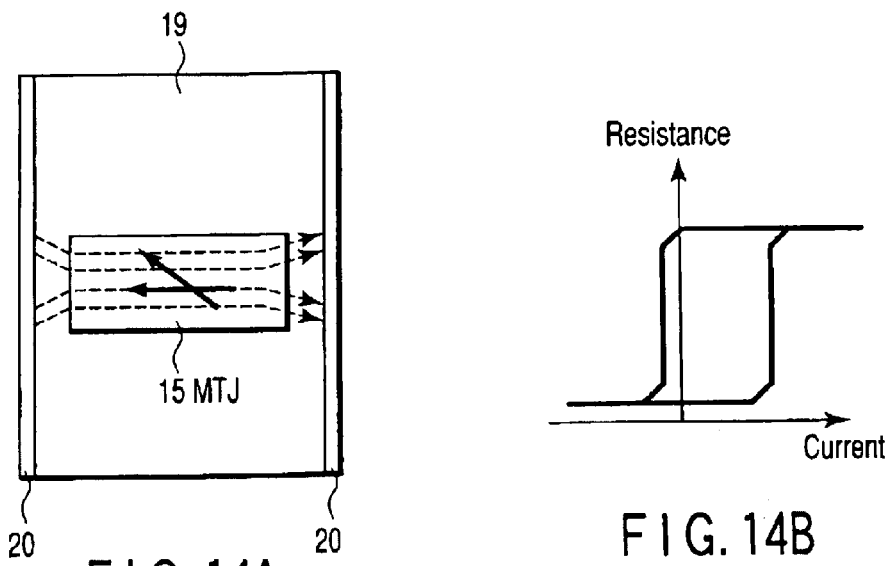
FIG. 14A
PRIOR ART
FIG. 14B
PRIOR ART
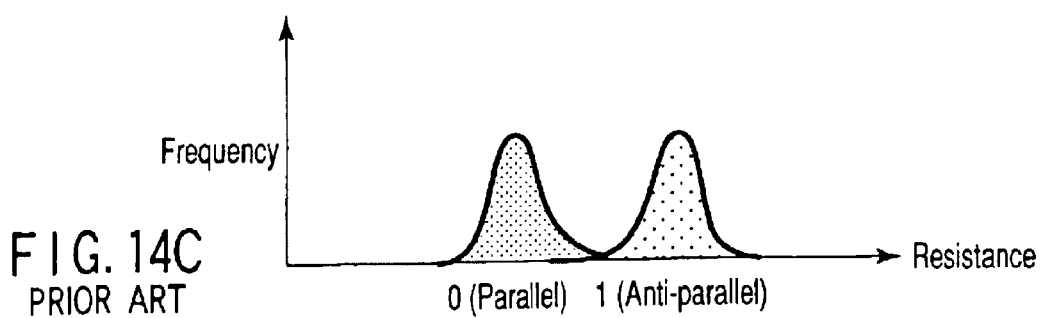
FIG. 14C
PRIOR ART

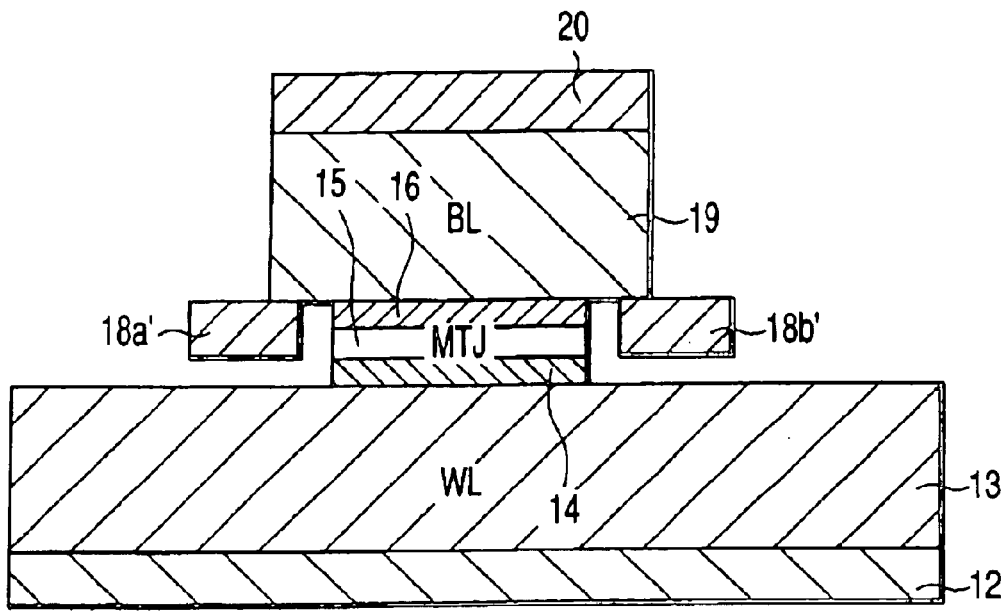
F I G. 22A
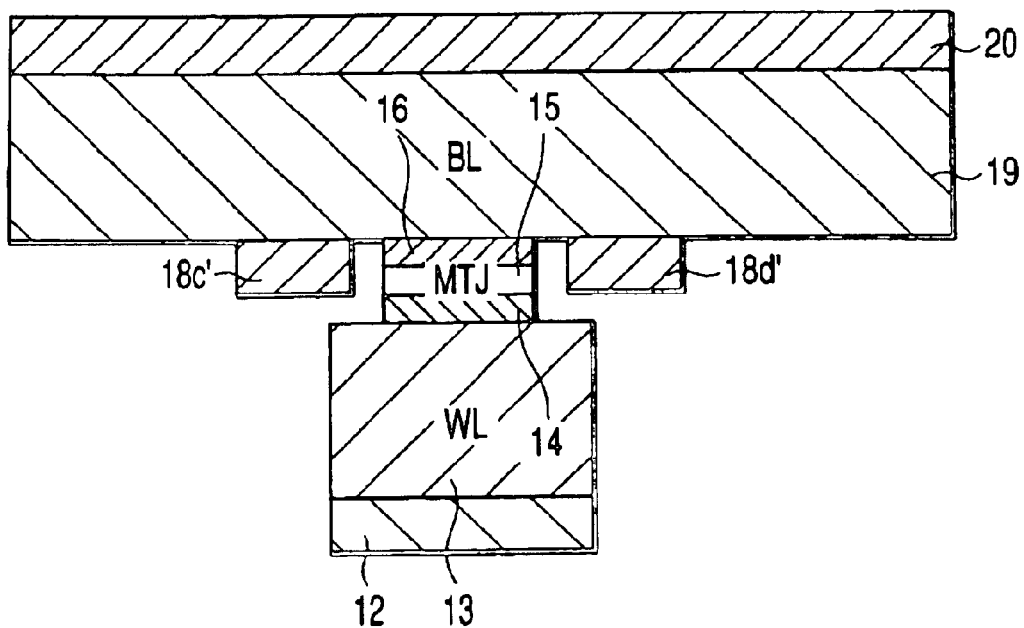
F I G. 22B

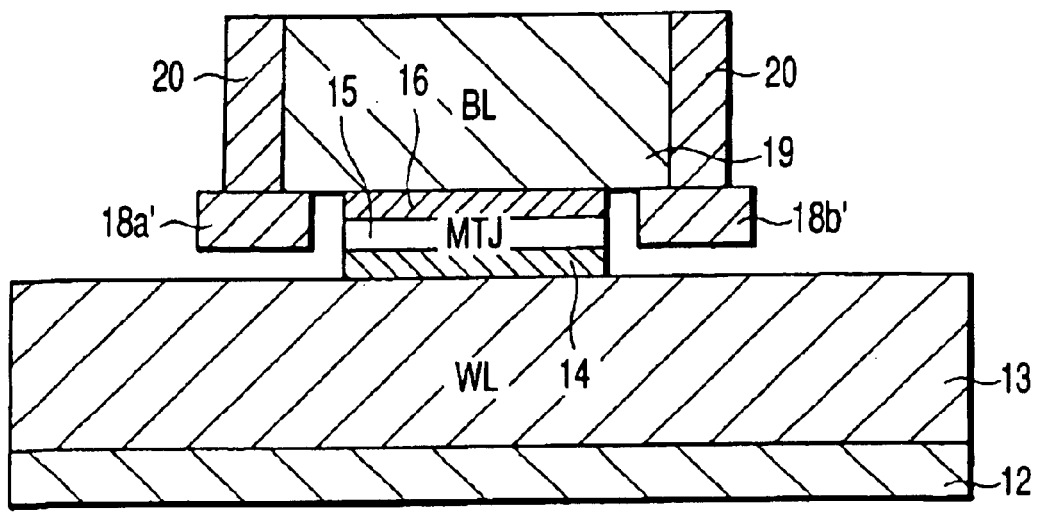
F I G. 24A
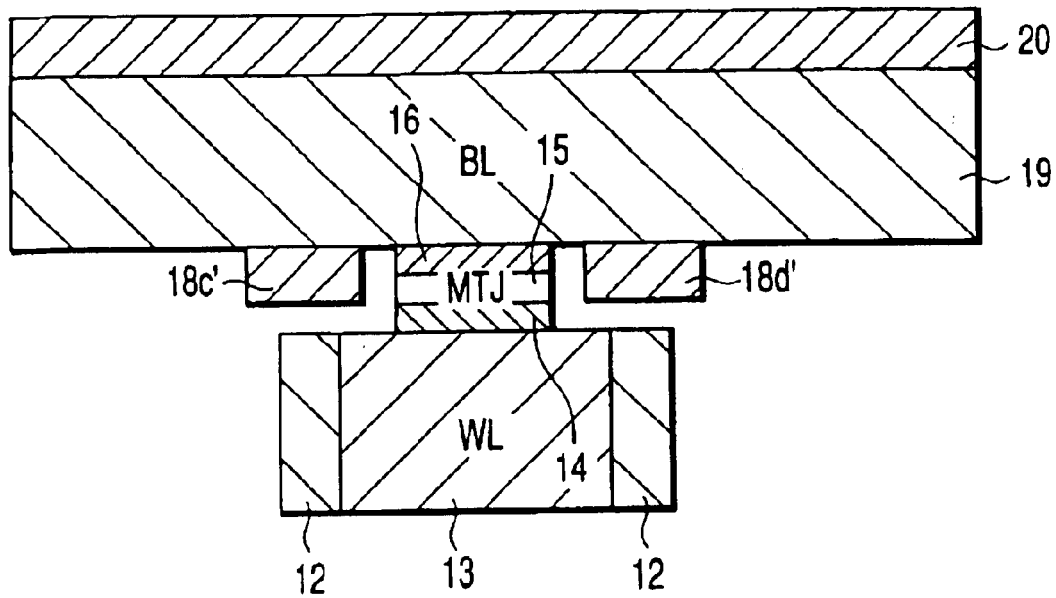
F I G. 24B

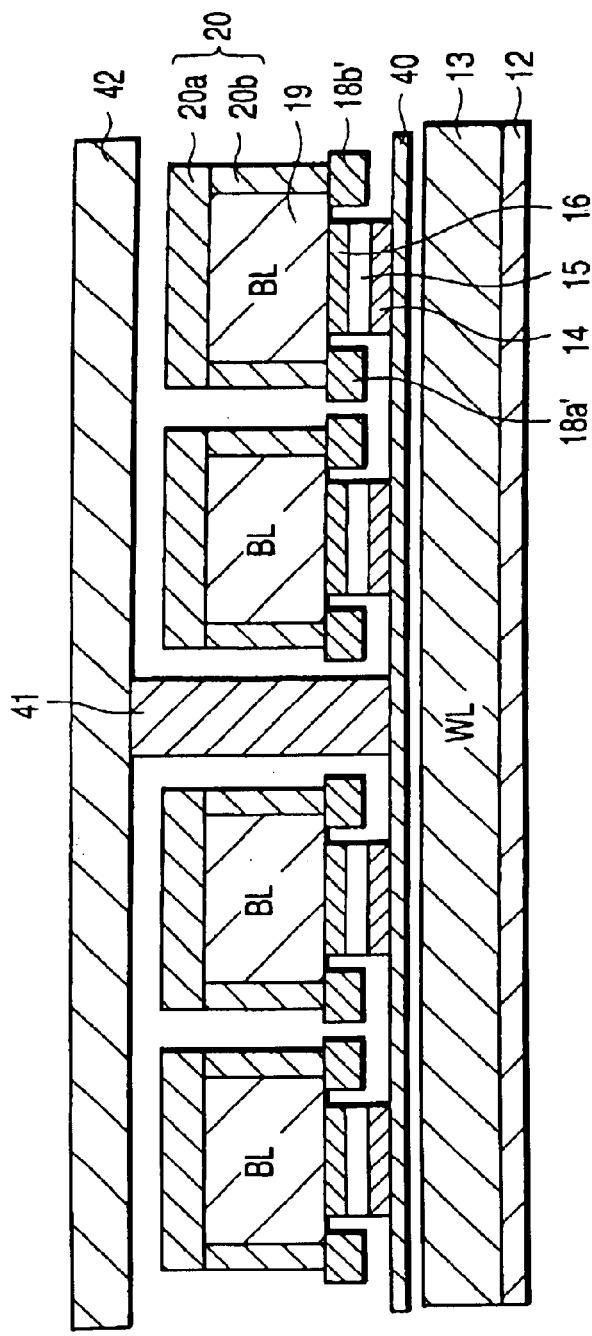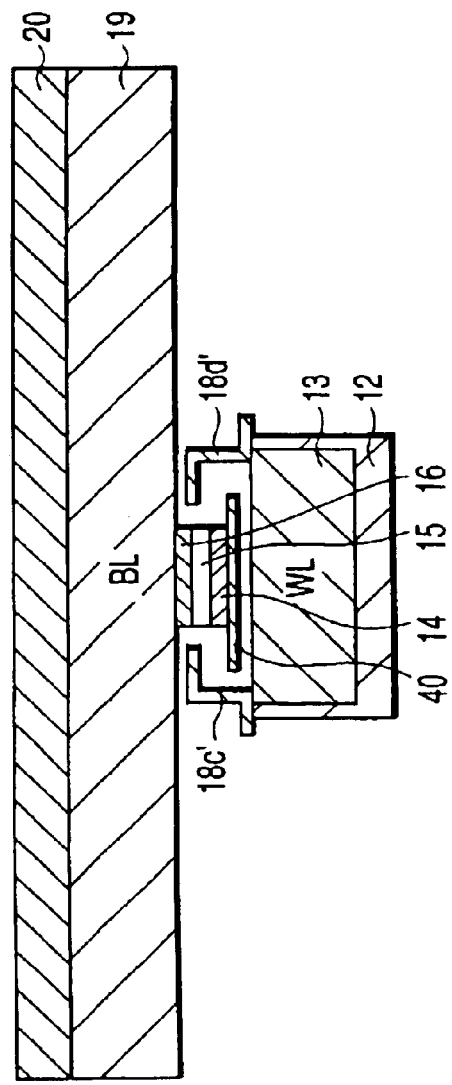
F I G. 32A
F I G. 32B

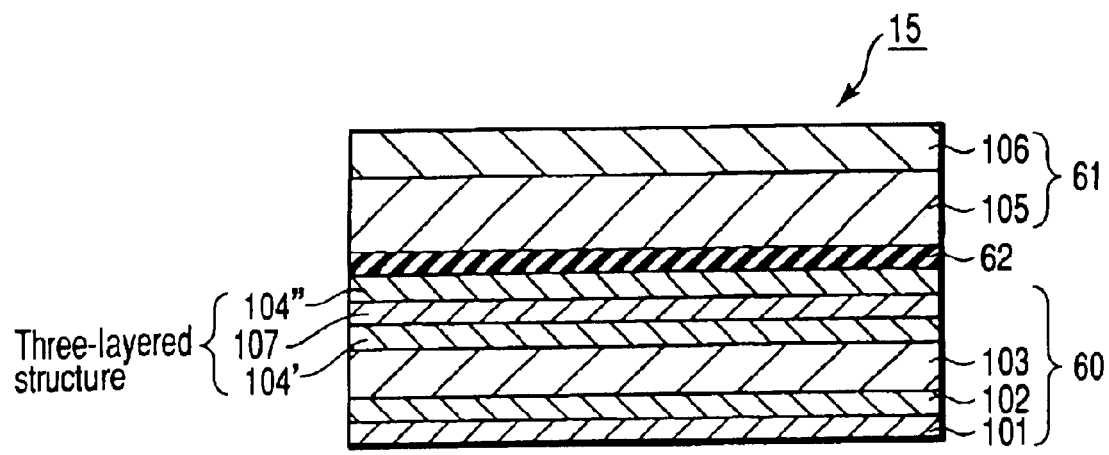
F I G. 39A
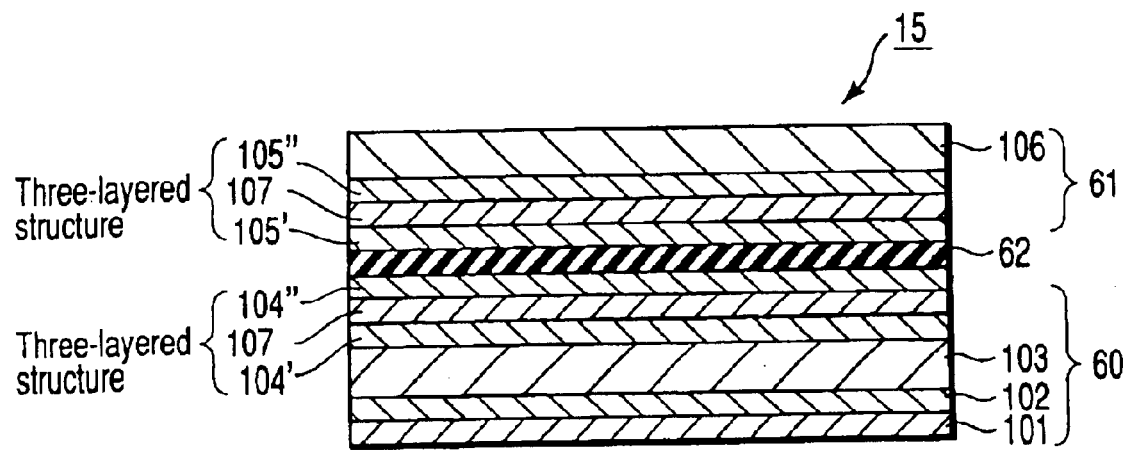
F I G. 39B

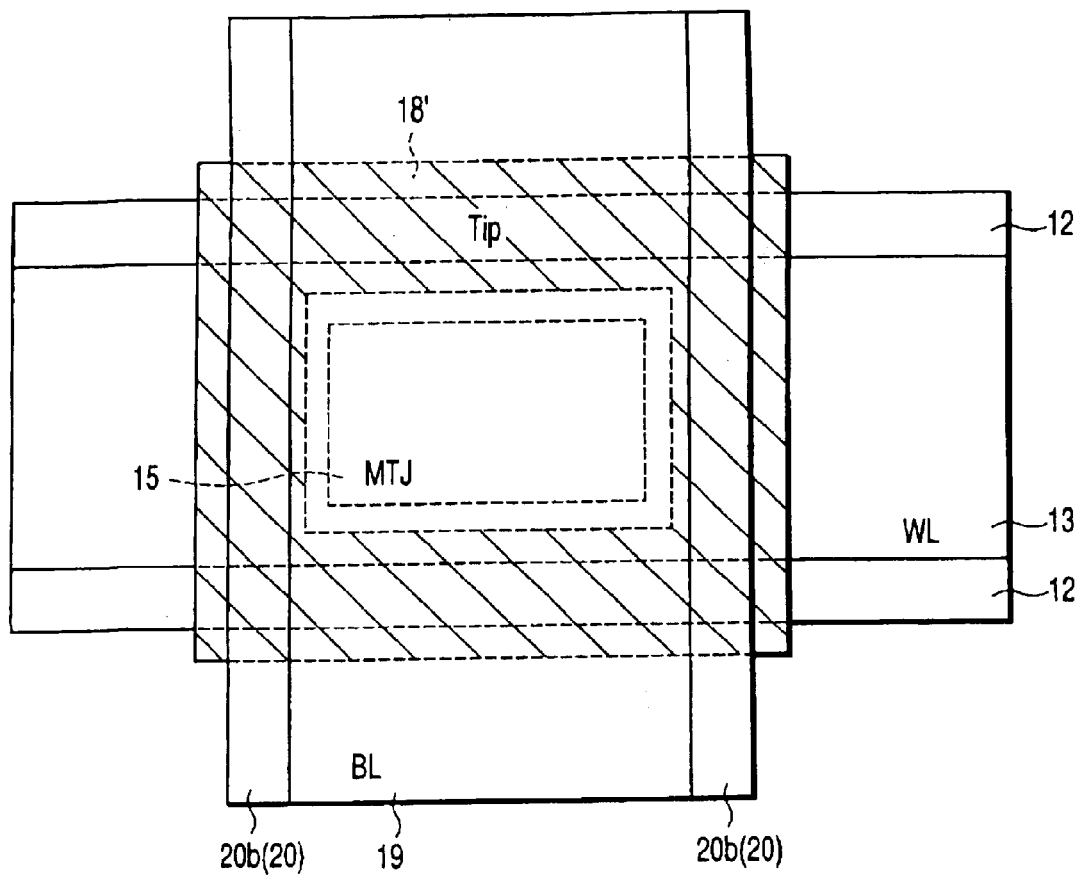
F I G. 43
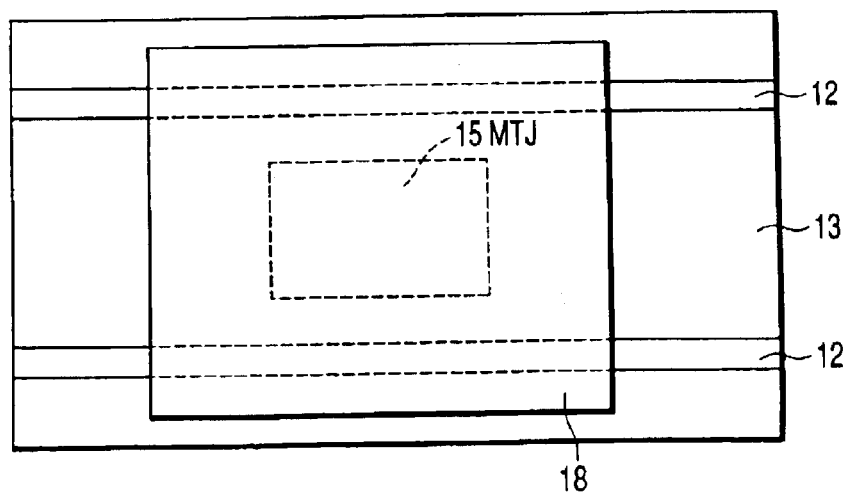
F I G. 44

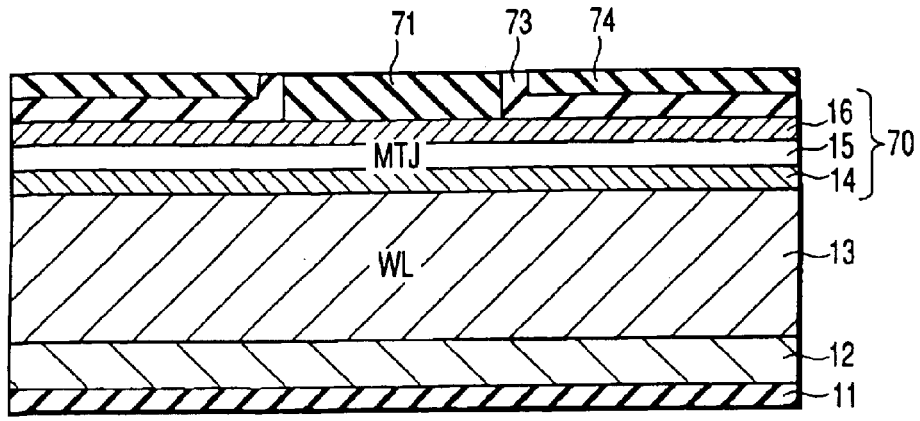
F I G. 48
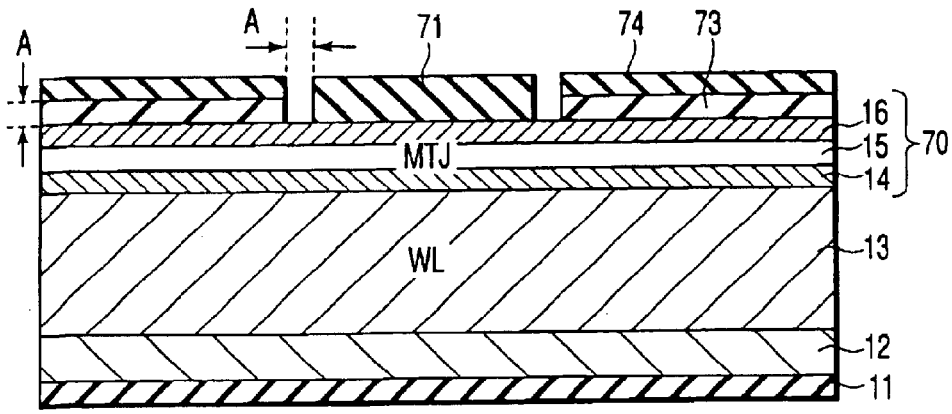
F I G. 49
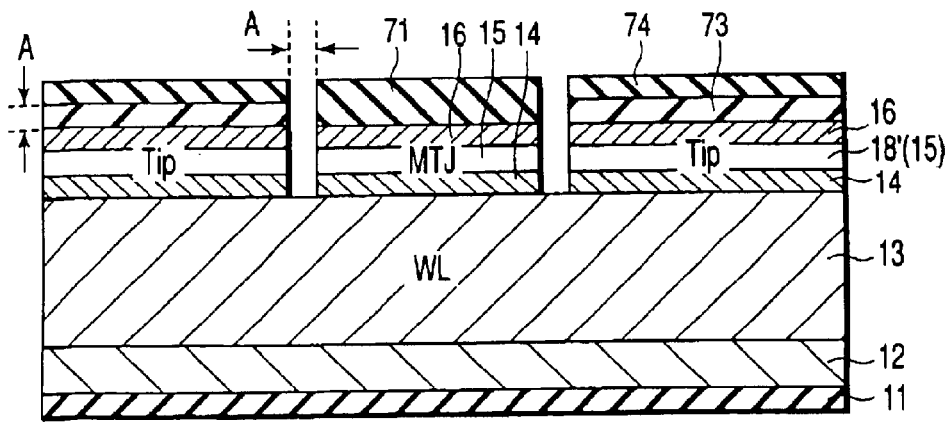
F I G. 50

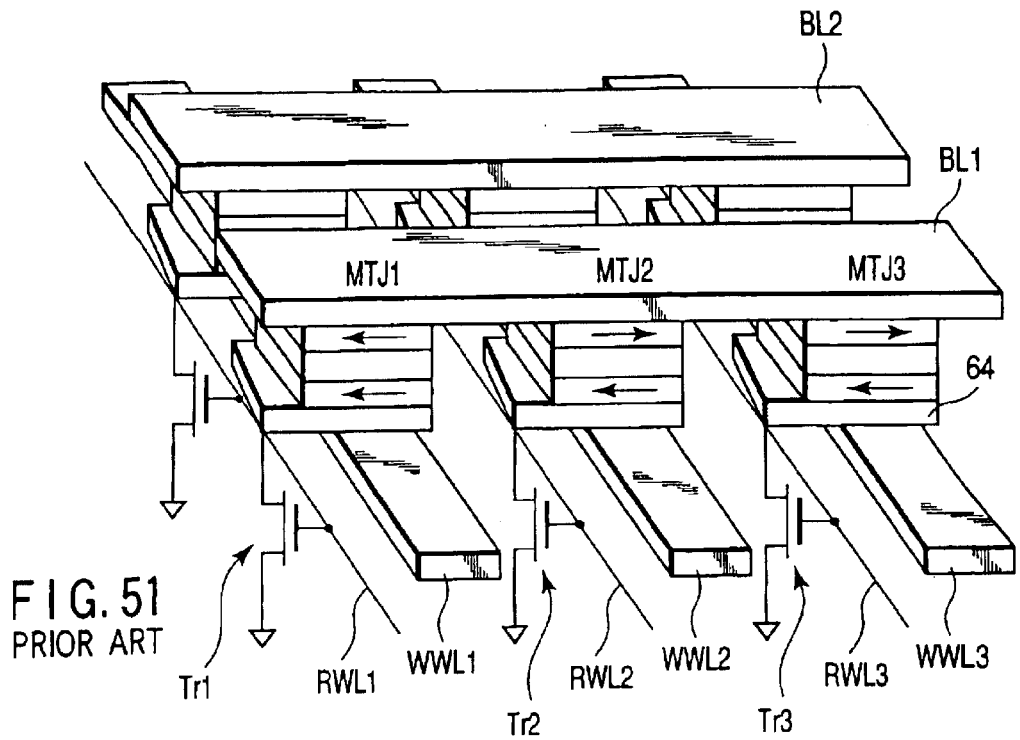
FIG. 51 PRIOR ART
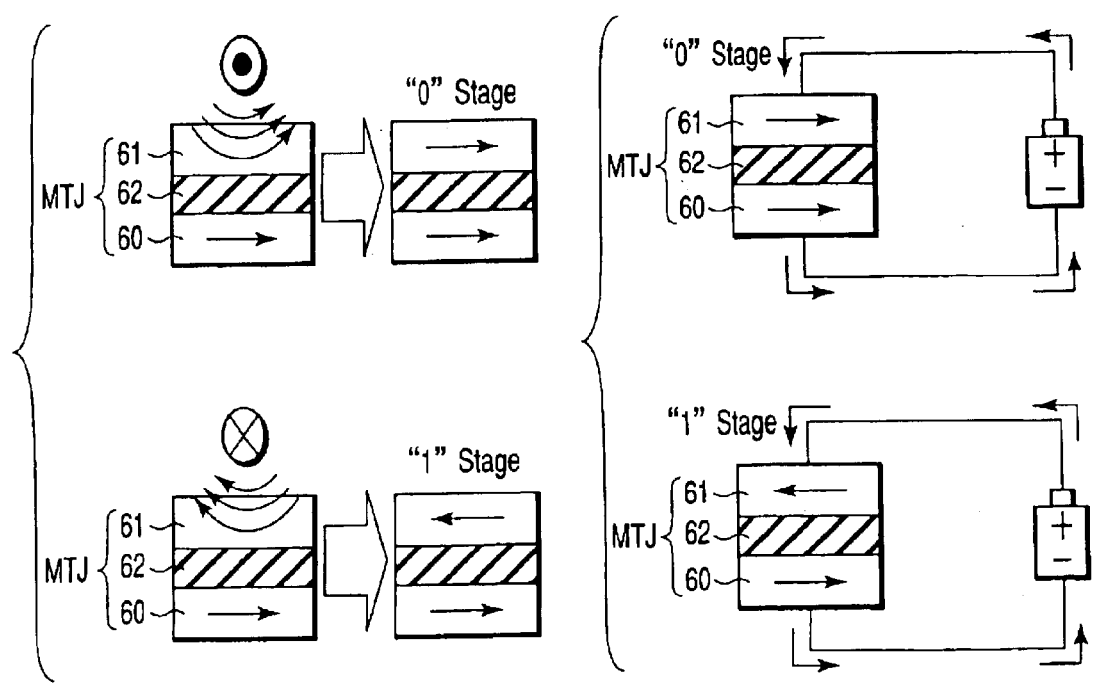
FIG. 52A PRIOR ART
FIG. 52B PRIOR ART

MAGNETIC MEMORY DEVICE HAVING YOKE LAYER, AND MANUFACTURING METHOD

CROSS-REFERENCE TO RELATED APPLICATIONS

This application is a divisional of application Ser. No. 10/379,656 filed, Mar. 6, 2003, which is based upon and claims the benefit of priority from the prior Japanese Patent Applications No. 2002-221877, filed Jul. 30, 2002; and No. 2002-324105, filed Nov. 7, 2002, the entire contents of both of which are incorporated herein by reference.

BACKGROUND OF THE INVENTION

1. Field of the Invention

The present invention relates to a magnetic memory device which writes information by a current magnetic field every bit and reads out pieces of information "1" and "0" by a resistance change depending on the cell magnetization state, and a manufacturing method thereof.

2. Description of the Related Art

MRAMs (Magnetic Random Access Memories) have recently been proposed as a nonvolatile, high-speed device with a high integration degree and high reliability. As an MRAM memory element, MTJ (Magnetic Tunnel Junction) elements which exhibit a larger read output than that of a GMR (Giant Magneto-Resistance) element have enthusiastically been developed.

In the basic structure of the MRAM, as shown in FIG. 51, an MTJ element is arranged at the node between a bit line BL and a write word line WWL. The MTJ element is connected to the bit line BL via an upper metal layer (not shown) and to the source/drain of a MOS transistor Tr via a lower metal layer 64. The gate of the MOS transistor Tr functions as a read word line RWL.

The MTJ element is made up of a magnetically fixed layer (magnetic pinning layer) 60 of a ferromagnetic layer connected to the lower metal layer 64, a magnetic recording layer (magnetic free layer) 61 of a ferromagnetic layer connected to the bit line BL via an upper metal layer (not shown), and a tunnel junction layer 62 of a nonmagnetic layer sandwiched between the magnetically fixed layer 60 and the magnetic recording layer 61.

Data write/read in/from the MRAM will be explained with reference to FIGS. 52A and 52B.

Write of data in an arbitrarily selected cell will be explained with reference to FIG. 52A. A current flowing in the upward direction with respect to the sheet surface of FIG. 52A generates a magnetic field counterclockwise, and the magnetization of the magnetic recording layer 61 orients right. The magnetization directions of the magnetically fixed layer 60 and magnetic recording layer 61 coincide with each other (which is called parallel magnetization). In this state, for example, data "0" is stored. A current flowing in the downward direction with respect to the sheet surface of FIG. 52A generates a magnetic field clockwise, and the magnetization of the magnetic recording layer 61 orients left. The magnetization directions of the magnetically fixed layer 60 and magnetic recording layer 61 become different from each other (which is called anti-parallel magnetization). In this state, for example, data "1" is stored.

Read of data from a selected cell in which data "1" or "0" is written will be described with reference to FIG. 52B. When the magnetization of the MTJ element is parallel, its resistance is lowest; when the magnetization of the MTJ element is anti-parallel, its resistance is highest. By supplying a current through the MTJ element, the resistance of the MTJ element is read to determine a "1" or "0" memory state.

In order to rewrite data of a memory cell in this MRAM, the magnetization of the recording layer (e.g., an NiFe thin film with a film thickness of 2 to 5 nm) of the MTJ element must be switched. A magnetic field H necessary to switch the magnetization is given by equation (1). In equation (1), Ms is the saturation magnetization of the recording layer, t is the thickness of the recording layer, and F is the width of the recording layer.

$$H \text{ to } 4\pi M_s \times t/F (Oe) \quad (1)$$

When the cell width and cell length of the MTJ element are about 0.6 μm and about 1.2 μm, respectively, the write current value is about 8 mA.

Ensuring thermal agitation resistance poses limitations on decreasing the thickness of the recording layer of the MTJ element. To miniaturize the MTJ element up to about 0.15 μm, the recording layer must be made thick. Even if the film thickness of a CoFeNi recording layer can be fixed to 2 nm, a smaller-size MTJ element (smaller recording layer width F) increases the switching magnetic field H. This requires a large write current.

The current density which can be supplied to the write wiring has an upper limit (e.g., the current density is $10^7$ A/cm$^2$ for Cu wiring). Hence, even if the write current must be increased along with the above-mentioned miniaturization of the MTJ element, the sectional area of the write wiring decreases with the shrink in cell size. A current which generates the switching magnetic field H necessary to switch the magnetization of the recording layer cannot be supplied to the write wiring.

In the conventional wiring without any yoke, the write current which generates the switching magnetic field H must be increased along with the shrink in cell size (decrease in recording layer width F), as shown in FIG. 53. However, a current which can be supplied to the write wiring is restricted due to the decrease in the sectional area of the write wiring. The cell can only shrink in feature size to about 1/F=8.

To solve this problem, wiring with a yoke (see FIG. 54) prepared by covering write wiring (Cu) with a soft magnetic material 63 such as NiFe has been proposed. In the wiring with a yoke, the generated magnetic field of the write wiring can be concentrated on a selected cell by the yoke. It is reported that the wiring with a yoke exhibits about double the efficiency (write current value of 1/2) (see, e.g., Saied Tehrani, "Magneto resistive RAM", IEDM short course, USA, 2001).

At present, demands have arisen for a further decrease in write current for a smaller cell.

BRIEF SUMMARY OF THE INVENTION

According to the first aspect of the present invention, there is provided a magnetic memory device comprising first wiring which runs in a first direction, second wiring which runs in a second direction different from the first direction, a magneto-resistance element which is arranged between the first wiring and the second wiring at an intersection between the first wiring and the second wiring, a first yoke main body which covers at least either of a lower surface and two side surfaces of the first wring, a second yoke main body which covers at least either of an upper surface and two side surfaces of the second wiring, first and second yoke tips which are arranged on two sides of the magneto-resistance element in the first direction at an interval from the magneto-resistance element, and third and fourth yoke tips which are arranged on two sides of the magneto-resistance element in the second direction at an interval from the magneto-resistance element.

According to the second aspect of the present invention, there is provided a magnetic memory device manufacturing method, comprising forming first wiring, at least either of a lower surface and two side surfaces of which is covered with a first yoke main body, forming on the first wiring a magneto-resistance element which is sandwiched between first and second layers, forming an insulating film on the first wiring and the second layer, forming a magnetic film on the insulating film, patterning the magnetic film, removing part of the second layer, the magnetic film, and the insulating film on the magneto-resistance element to form first to fourth yoke tips from the magnetic film in self-alignment with the magneto-resistance element, forming second wiring on the second layer and the first to fourth yoke tips, and forming a second yoke main body which covers at least either of an upper surface and two side surfaces of the second wiring.

BRIEF DESCRIPTION OF THE SEVERAL VIEWS OF THE DRAWING

FIGS. 3, 4, 5, 6, 7, 8, and 9 are sectional views showing the steps in manufacturing the magnetic memory device according to the first embodiment of the present invention;

FIG. 13 is a sectional view showing another step subsequent to FIG. 5 in manufacturing the magnetic memory device according to the first embodiment of the present invention;

FIG. 14A is a plan view showing a conventional magnetic memory device;

FIG. 14B is a graph showing a conventional hysteresis curve;

FIG. 14C is a graph showing a conventional read signal;

FIG. 22A is a sectional view showing the magnetic memory device taken along the line XXIIA—XXIIA in FIG. 21;

FIG. 22B is a sectional view showing the magnetic memory device taken along the line XXIIB—XXIIB in FIG. 21;

FIG. 24A is a sectional view showing the magnetic memory device taken along the line XXIVA—XXIVA in FIG. 23;

FIG. 24B is a sectional view showing the magnetic memory device taken along the line XXIVB—XXIVB in FIG. 23;

FIG. 32A is a sectional view showing the magnetic memory device taken along the line XXXIIA—XXXIIA in FIG. 31;

FIG. 32B is a sectional view showing the magnetic memory device taken along the line XXXIIB—XXXIIB in FIG. 31;

FIGS. 39A and 39B are sectional views showing an MTJ element having a single junction structure according to each embodiment of the present invention;

FIG. 43 is a plan view showing a magnetic memory device according to the 15th embodiment of the present invention;

FIG. 44 is a plan view showing the shape of a magnetic film after patterning its periphery in the magnetic memory device according to the 15th embodiment of the present invention;

FIGS. 45, 46, 47, 48, 49, and 50 are sectional views showing the steps in manufacturing a magnetic memory device according to the 16th embodiment of the present invention;

FIG. 51 is a perspective view showing a conventional magnetic memory device;

FIG. 52A is a view showing data write of the conventional magnetic memory device;

FIG. 52B is a view showing data read of the conventional magnetic memory device;

DETAILED DESCRIPTION OF THE INVENTION

Figure 54:
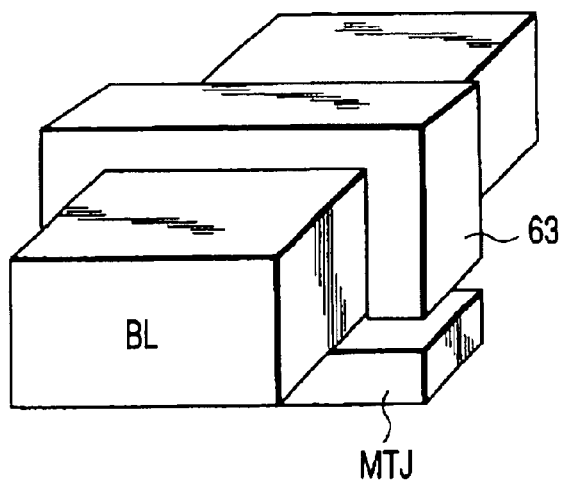
FIG. 54 is a perspective view showing a conventional magnetic memory device with a yoke.

Conventional wiring with a yoke shown in FIG. 54 was examined by experiment and computer simulation. The double efficiency could be confirmed, similar to the report, but the following serious drawbacks were found.

First, disturbs (erroneous write in a half-selected cell) increased. In wiring without any yoke, disturbs occurred in about 50 cells every 1,000 cells. In the use of wiring with a yoke, disturbs abruptly increased and occurred in about 250 cells every 1,000 cells.

Figure 55A:
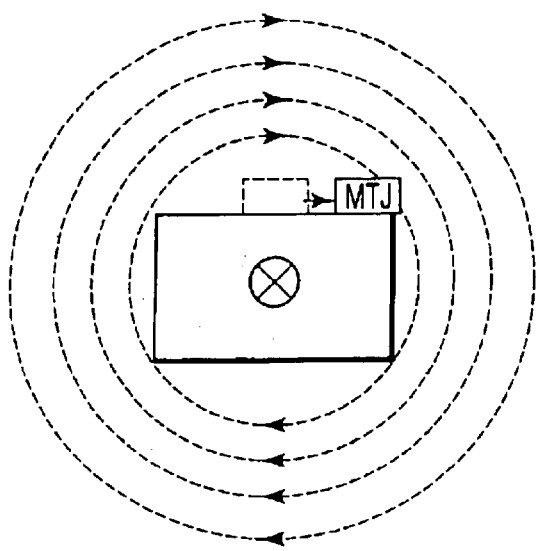
FIG. 55A is a sectional view showing a conventional magnetic memory device without any yoke.
Figure 55B:
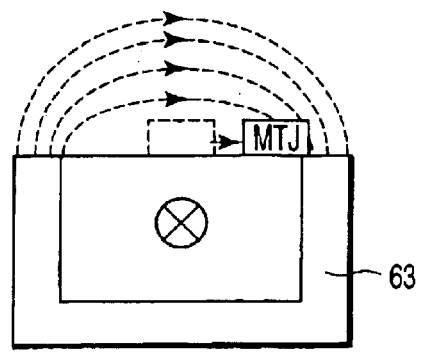
FIG. 55B is a sectional view showing a conventional magnetic memory device having wiring with a yoke.

The cause of increasing disturbs was large misalignment between an MTJ (Magnetic Tunnel Junction) element as a magneto-resistance element and the write wiring. In the wiring without any yoke, as shown in FIG. 55A, a magnetic field was generated around the write wiring and could switch the magnetization of the MTJ element even with misalignment between the wiring and the MTJ element. In the wiring with a yoke, as shown in FIG. 55B, the magnetic field was concentrated from end to end of a yoke 63. Misalignment between the wiring and the MTJ element may inhibit magnetization switching of the MTJ element. That is, the use of the wiring with a yoke decreases the wiring misalignment allowance. More specifically, for a 0.24-$\mu$m wide MTJ element, even a misalignment of about 0.1 $\mu$m cannot be tolerated. The misalignment must be suppressed to about 0.05 $\mu$m or less.

Figure 56A:
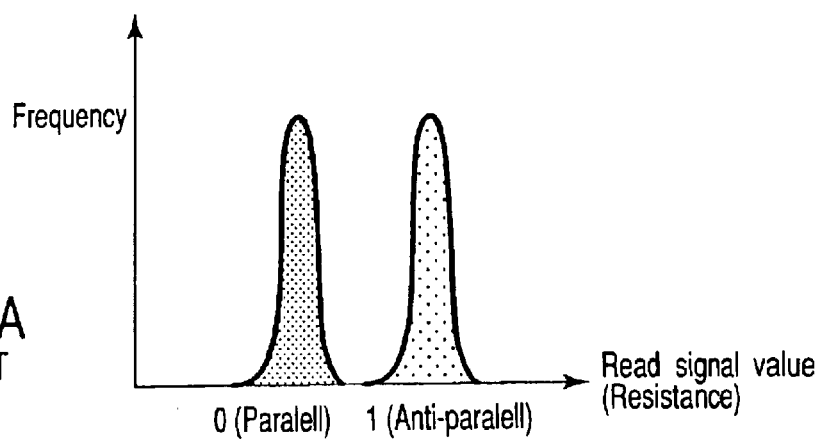
FIG. 56A is a graph showing a read signal in a conventional magnetic memory device having wiring without any yoke.
Figure 56B:
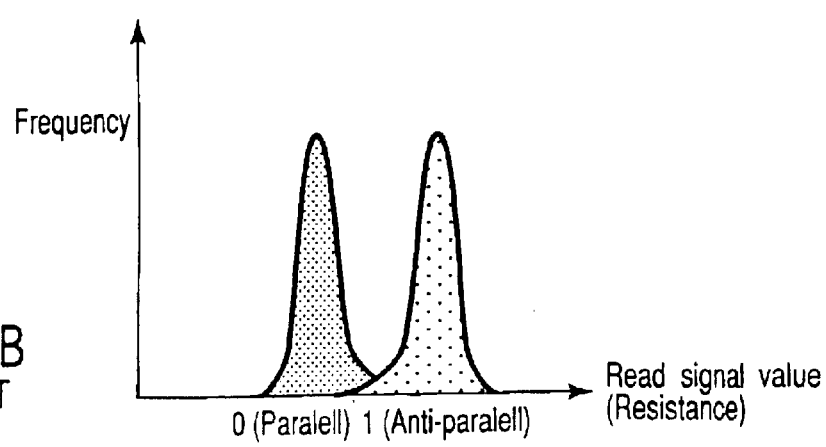
FIG. 56B is a graph showing a read signal in the conventional magnetic memory device having wiring with a yoke.

Second, variations in read signal increased. In the wiring without any yoke, as shown in FIG. 56A, the read signal hardly varied in the "0" and "1" states, and "0" and "1" could be satisfactorily discriminated. In the wiring with a yoke, as shown in FIG. 56B, variations in read signal in the "0" and "1" states increased, and it became difficult to discriminate "0" and "1". More specifically, variations with respect to an average resistance value for 1$\sigma$ were 3% in the wiring without any yoke, but increased to about 5% in the wiring with a yoke.

Variations in read signal are not necessarily related to misalignment between the write wiring and the MTJ element, and occur at random. The variations are estimated to occur due to variations in "0" and "1" resistance values because the remanent magnetization of the yoke disturbs the magnetization location of the MTJ element and the magnetization of mainly the recording layer is inclined from an ideal "0" state (magnetization directions of the fixed layer and recording layer are parallel) or "1" state (magnetization directions of the fixed layer and recording layer are anti-parallel).

Third, cells in which thermal agitation resistance decreased appeared. Bad bits at which data changed from "0" to "1" or from "1" to "0" appeared when left to stand for about 60 days. No bad bit was generated every 1,000 cells in the wiring without any yoke. In the wiring with a yoke, however, bad bits were found in about 10 cells every 1,000 cells.

Preferred embodiments of the present invention that reduce the write current and solve the above problems will be explained below with reference to several views of the accompanying drawing. In the following description, the same reference numerals denote the same parts through the drawing.

First Embodiment

The first embodiment concerns a basic structure for each embodiment in which a yoke tip magnetically coupled to a yoke main body is arranged around an MTJ element. The yoke tip is formed in self-alignment with the MTJ element.

Figure 1:
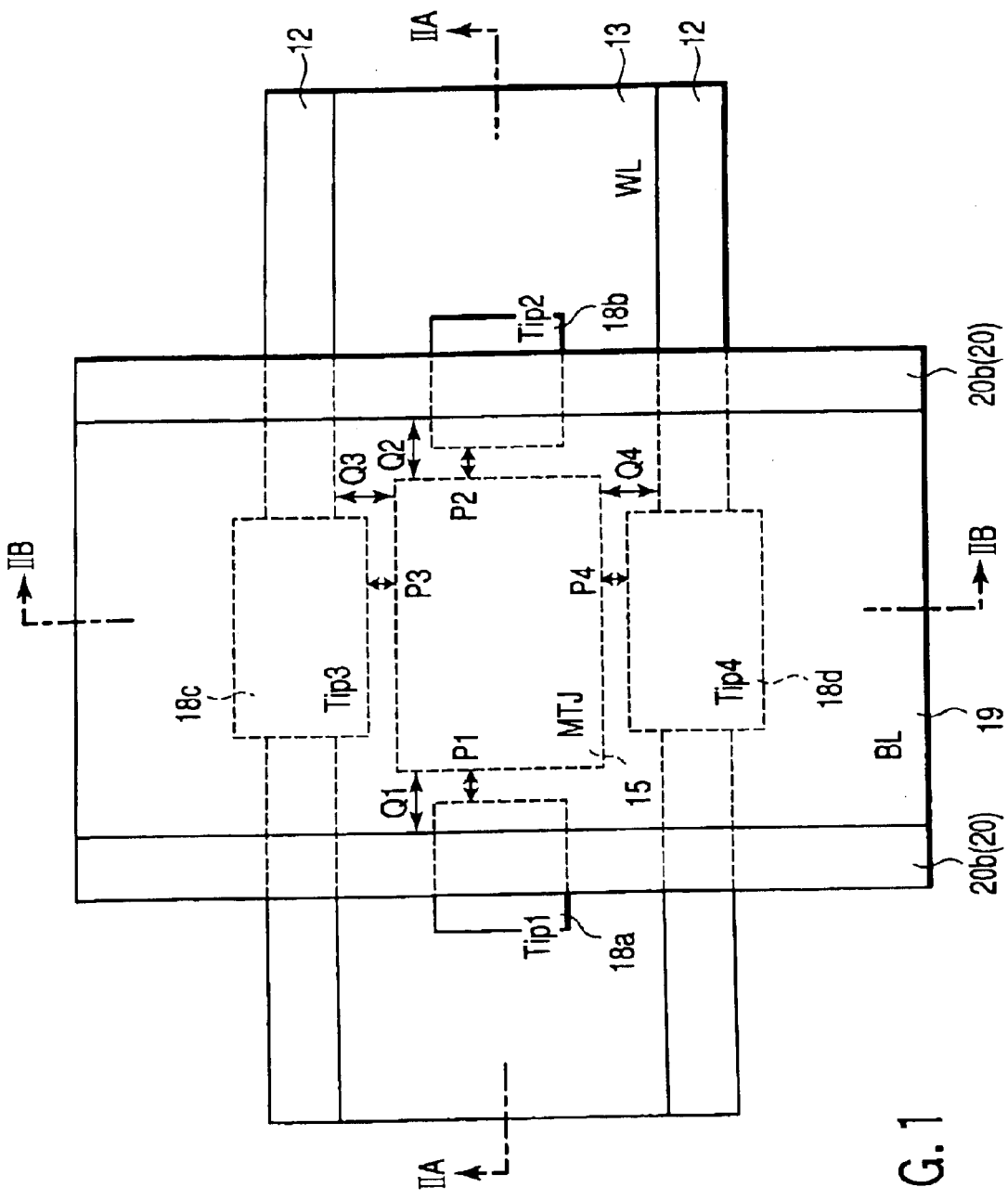
FIG. 1 is a plan view showing a magnetic memory device according to the first embodiment of the present invention.
Figure 2A:
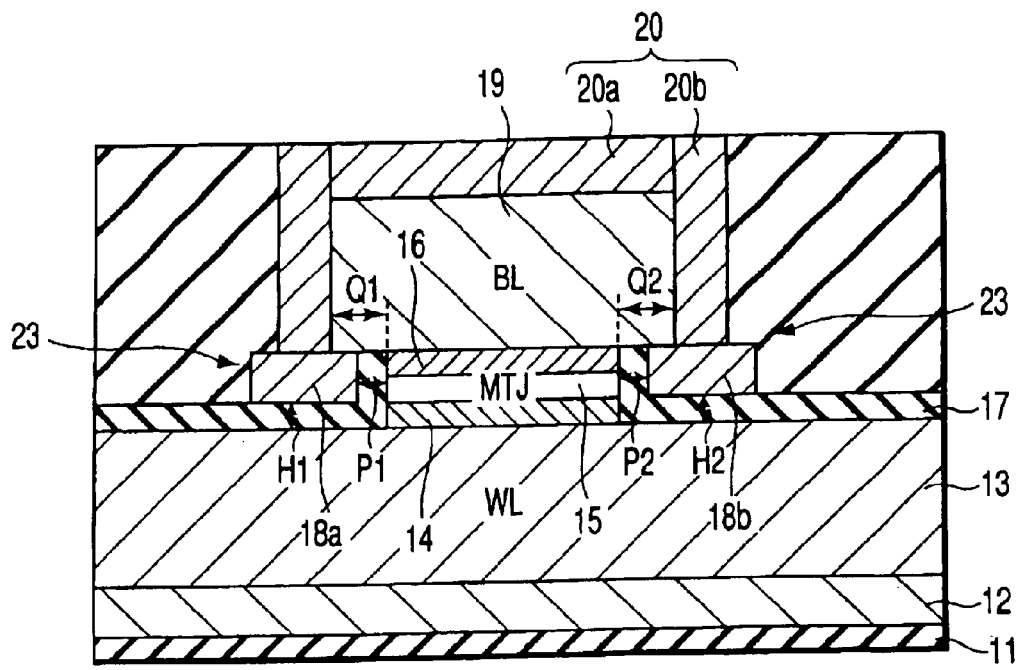
FIG. 2A is a sectional view showing the magnetic memory device taken along the line IIA—IIA in FIG. 1.
Figure 2B:
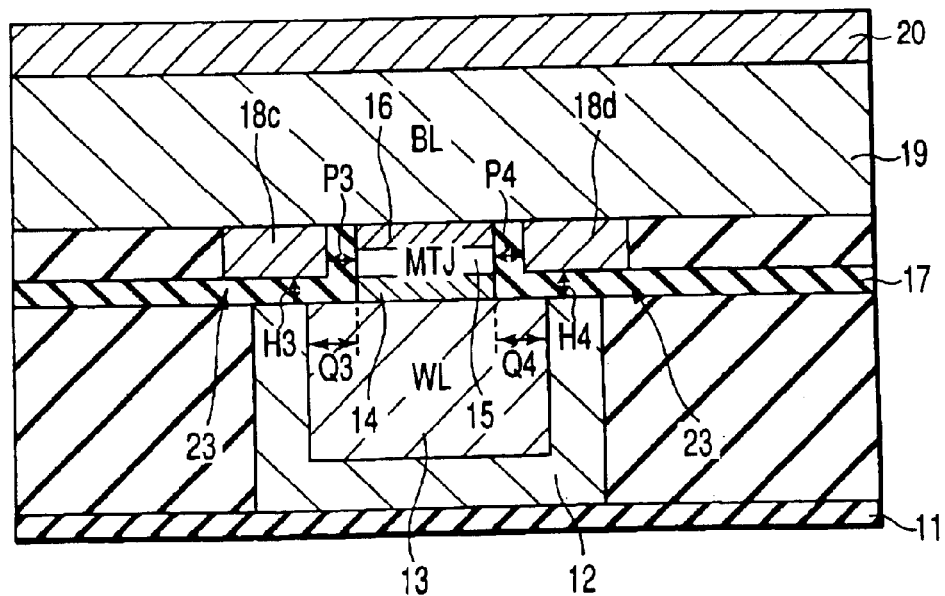
FIG. 2B is a sectional view showing the magnetic memory device taken along the line IIB—IIB in FIG. 1.

FIG. 1 is a plan view showing a magnetic memory device according to the first embodiment of the present invention. FIG. 2A is a sectional view showing the magnetic memory device taken along the line IIA—IIA in FIG. 1. FIG. 2B is a sectional view showing the magnetic memory device taken along the line IIB—IIB in FIG. 1.

In the magnetic memory device according to the first embodiment, as shown in FIGS. 1, 2A, and 2B, a bit line 19 and word line 13 which are made of, e.g., Cu run in different directions. An MTJ element 15 is arranged between the bit line 19 and the word line 13 at the node between the bit line 19 and the word line 13. A first yoke main body 12 is so formed as to cover the lower and side surfaces of the word line 13. A second yoke main body 20 is so formed as to cover the upper and side surfaces of the bit line 19. First, second, third, and fourth yoke tips 18a, 18b, 18c, and 18d are formed around the MTJ element 15. The first and second yoke tips 18a and 18b are arranged at an interval from the MTJ element 15 on the two sides of the MTJ element 15 in a direction in which the word line 13 runs. The third and fourth yoke tips 18c and 18d are arranged at an interval from the MTJ element 15 on the two sides of the MTJ element 15 in a direction in which the bit line 19 runs.

The first and second yoke tips 18a and 18b are in contact with the second yoke main body 20 (20b), and spaced apart from the first yoke main body 12. The first and second yoke tips 18a and 18b may be physically spaced apart from the second yoke main body 20 as long as they are magnetically coupled to it. Magnet static coupling between the first and second yoke tips 18a and 18b and the second yoke main body 20 means that the magnetization of the first and second yoke tips 18a and 18b is influenced not by a magnetic field generated by a current flowing through the bit line 19 but by the magnetization of the second yoke main body 20. When the first and second yoke tips 18a and 18b are in contact with the second yoke main body 20, they must be electrically insulated from the word line 13 and first yoke main body 12 in order to prevent electrical connection between the bit line 19 and the word line 13.

The third and fourth yoke tips 18c and 18d are spaced apart from the first and second yoke main bodies 12 and 20, and magnetically coupled to the first yoke main body 12. The third and fourth yoke tips 18c and 18d may physically contact the first yoke main body 12. In this case, the third and fourth yoke tips 18c and 18d must be electrically insulated from the bit line 19 and second yoke main body 20 in order to prevent electrical connection between the bit line 19 and the word line 13.

A nonmagnetic film, e.g., an insulating film 17 is formed between the first, second, third, and fourth yoke tips 18a, 18b, 18c, and 18d and the MTJ element 15 and between the first, second, third, and fourth yoke tips 18a, 18b, 18c, and 18d and the word line 13. The first, second, third, and fourth yoke tips 18a, 18b, 18c, and 18d are formed on the same surface of the insulating film 17.

The film thickness of the insulating film 17 defines first distances P1, P2, P3, and P4 and second distances H1, H2, H3, and H4. The first distances P1, P2, P3, and P4 and the second distances H1, H2, H3, and H4 are almost the same. The first distances P1, P2, P3, and P4 are distances between the first, second, third, and fourth yoke tips 18a, 18b, 18c, and 18d and the MTJ element 15. The second distances H1, H2, H3, and H4 are distances between the first, second, third, and fourth yoke tips 18a, 18b, 18c, and 18d and the word line 13 (first yoke main body 12).

When the word line 13 runs in the longitudinal direction (long direction) of the MTJ element 15 and the bit line 19 runs in a direction perpendicular to the word line 13, the width of the bit line 19 may be made thicker than that of the word line 13, and third distances Q1 and Q2 between the MTJ element 15 and the second yoke main body 20b and fourth distances Q3 and Q4 between the MTJ element 15 and the first yoke main body 12 may be made almost equal to each other.

The first, second, third, and fourth yoke tips 18a, 18b, 18c, and 18d are separated from each other.

The first, second, third, and fourth yoke tips 18a, 18b, 18c, and 18d have easy axes of magnetization which orient in the long direction. The easy axis of magnetization may have biaxial anisotropy, but desirably has uniaxial anisotropy due to the following reasons. First, the easy axis of magnetization with uniaxial anisotropy stabilizes the magnetic domain structures of the yoke tips 18a, 18b, 18c, and 18d, improves the magnetic characteristic reproducibility, and can ensure the write reproducibility. Second, the first and second yoke tips 18a and 18b which should be magnetically coupled to the bit line 19 are hardly magnetically coupled to the word line 13. The third and fourth yoke tips 18c and 18d which should be magnetically coupled to the word line 13 are hardly magnetically coupled to the word line 19, greatly reducing the interference.

The first, second, third, and fourth yoke tips 18a, 18b, 18c, and 18d and the first and second yoke main bodies 12 and 20 are preferably made of a soft magnetic material whose coercive force in the hard axis of magnetization of the film is 5 Oe (oersted) or less.

The first, second, third, and fourth yoke tips 18a, 18b, 18c, and 18d are desirably formed from a material different from that of the first and second yoke main bodies 12 and 20. For example, the first, second, third, and fourth yoke tips 18a, 18b, 18c, and 18d may be formed from a material having a high permeability than that of the first and second yoke main bodies 12 and 20. For example, the former is made of NiFe, and the latter is made of amorphous-CoZrNb or FeAlSi. The first, second, third, and fourth yoke tips 18a, 18b, 18c, and 18d may be formed from a material having a higher saturation flux density than that of the first and second yoke main bodies 12 and 20. For example, the former is made of CoFe, amorphous-CoZrNb, or $FeN_x$, and the latter is made of NiFe.

The MTJ element 15 is formed from, e.g., a multilayered film of Ta/PtMn/CoFe/Ru/CoFe/$AlO_x$/NiFe/Ta. The MTJ element 15 may take a single junction structure made up of a magnetic recording layer, a magnetically fixed layer, and a tunnel junction layer sandwiched between the magnetic recording layer and the magnetically fixed layer. The MTJ element 15 may take a double junction structure made up of first and second magnetically fixed layers, a magnetic recording layer sandwiched between the first and second magnetically fixed layers, a first tunnel junction layer sandwiched between the first magnetically fixed layer and the magnetic recording layer, and a second tunnel junction layer sandwiched between the second magnetically fixed layer and the magnetic recording layer. The magnetically fixed layer and magnetic recording layer may be a single-layered structure, or a three-layered structure formed from the first ferromagnetic layer, nonmagnetic layer, and second ferromagnetic layer.

An example of the MTJ element 15 with the above-mentioned single junction structure will be explained with reference to FIGS. 39A and 39B. As shown in FIG. 39A, the MTJ element 15 with the single junction structure may be constituted by a magnetically fixed layer 60 obtained by sequentially stacking a template layer 101, initial ferromagnetic layer 102, anti-ferromagnetic layer 103, ferromagnetic layer 104', nonmagnetic layer 107, and ferromagnetic layer 104", a tunnel junction layer 62 formed on the magnetically fixed layer 60, and a magnetic recording layer 61 obtained by sequentially stacking a free ferromagnetic layer 105 and contact layer 106 on the tunnel junction layer 62. Alternatively, as shown in FIG. 39B, the MTJ element 15 with the single junction structure may be constituted by a magnetically fixed layer 60 obtained by sequentially stacking a template layer 101, initial ferromagnetic layer 102, anti-ferromagnetic layer 103, ferromagnetic layer 104', nonmagnetic layer 107, and ferromagnetic layer 104", a tunnel junction layer 62 formed on the magnetically fixed layer 60, and a magnetic recording layer 61 obtained by sequentially stacking a ferromagnetic layer 105', nonmagnetic layer 107, ferromagnetic layer 105', and contact layer 106 on the tunnel junction layer 62.

Figure 40A:
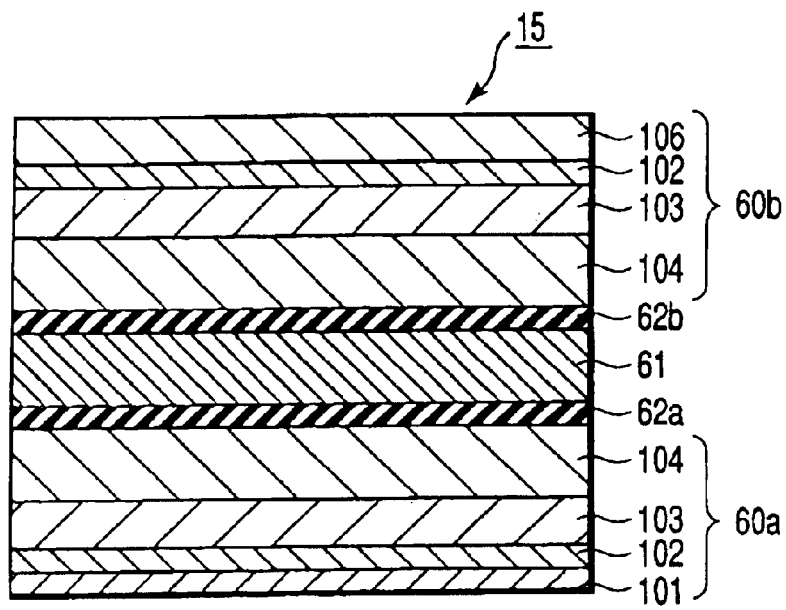
FIGS. 40A and 40B are sectional views showing an MTJ element having a double junction structure according to each embodiment of the present invention.

An example of the MTJ element 15 with the above-mentioned double junction structure will be explained with reference to FIGS. 40A and 40B. As shown in FIG. 40A, the MTJ element 15 with the double junction structure may be constituted by a first magnetically fixed layer 60a obtained by sequentially stacking a template layer 101, initial ferromagnetic layer 102, anti-ferromagnetic layer 103, and reference ferromagnetic layer 104, a first tunnel junction layer 62a formed on the first magnetically fixed layer 60a, a magnetic recording layer 61 formed on the first tunnel junction layer 62a, a second tunnel junction layer 62b formed on the magnetic recording layer 61, and a second magnetically fixed layer 60b obtained by sequentially stacking a reference ferromagnetic layer 104, anti-ferromagnetic layer 103, initial ferromagnetic layer 102, and contact layer 106 on the second tunnel junction layer 62b. Alternatively, as shown in FIG. 40B, the MTJ element 15 with the double junction structure may be constituted by a first magnetically fixed layer 60a obtained by sequentially stacking a template layer 101, initial ferromagnetic layer 102, anti-ferromagnetic layer 103, and reference ferromagnetic layer 104, a first tunnel junction layer 62a formed on the first magnetically fixed layer 60a, a magnetic recording layer 61 obtained by sequentially stacking a ferromagnetic layer 105', nonmagnetic layer 107, ferromagnetic layer 105" on the first tunnel junction layer 62a, a second tunnel junction layer 62b formed on the magnetic recording layer 61, and a second magnetically fixed layer 60b obtained by sequentially stacking a ferromagnetic layer 104', nonmagnetic layer 107, ferromagnetic layer 104', anti-ferromagnetic layer 103, initial ferromagnetic layer 102, and contact layer 106 on the second tunnel junction layer 62b.

The MTJ element 15 with such a double tunnel junction structure can operate at a higher bias with a smaller decrease in MR (Magneto Resistive) ratio (resistance change ratio between states "1" and "0") upon application of the same external bias than the MTJ element 15 with a single tunnel junction structure. The double tunnel junction structure is more advantageous to reading out information from a cell.

Figure 40B:
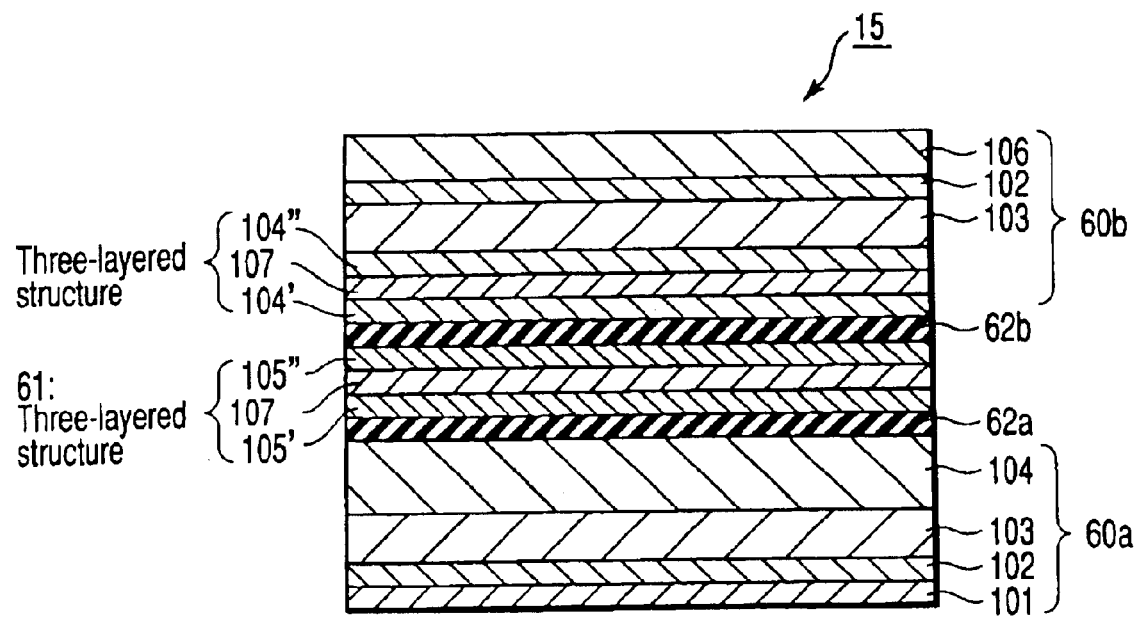

In FIGS. 39A, 39B, and 40B, the MTJ element 15 employs a three-layered structure made up of the ferromagnetic layer 104', nonmagnetic layer 107, and ferromagnetic layer 104" in the magnetically fixed layer 60 or 60b, and a three-layered structure made up of the ferromagnetic layer 105', nonmagnetic layer 107, and ferromagnetic layer 105" in the magnetic recording layer 61. This MTJ element 15 can provide a cell structure more suitable for miniaturization in which generation of a magnetic pole in a ferromagnet is suppressed.

The MTJ element 15 may be formed using, e.g., the following materials.

Examples of the materials of the magnetically fixed layers 60, 60a, and 60b and magnetic recording layer 61 are Fe, Co, Ni, an alloy of them, magnetite with a high spin polarizability, oxides such as $CrO_2$ and $RXMnO_{3-y}$ (R; rare-earth element, X; Ca, Ba, Sr), and Heusler alloys such as NiMnSb and PtMnSb. These magnetic materials may slightly contain a nonmagnetic element such as Ag, Cu, Au, Al, Mg, Si, Bi, Ta, B, C, O, N, Pd, Pt, Zr, Ir, W, Mo, or Nb as long as they do not lose ferromagnetism.

Preferable examples of the material of the anti-ferromagnetic layer 103 which constitutes part of the magnetically fixed layer 60, 60a, or 60b are Fe—Mn, Pt—Mn, Pt—Cr—Mn, Ni—Mn, Ir—Mn, NiO, and $Fe_2O_3$.

Examples of the material of the tunnel junction layers 62, 62a, and 62b are various dielectrics such as $Al_2O_3$, $SiO_2$, MgO, AlN, $Bi_2O_3$, $MgF_2$, $CaF_2$, $SrTiO_2$, and $AlLaO_3$. These dielectrics may have oxygen, nitrogen, or fluorine deficiency.

In the magnetic memory device, the first, second, third, and fourth yoke tips 18a, 18b, 18c, and 18d function as follows in data write. The first and second yoke tips 18a and 18b are magnetically coupled to the second yoke main body 20, and have a function of guiding to the MTJ element 15 a magnetic flux generated by a write current flowing through the bit line 19. The third and fourth yoke tips 18c and 18d are magnetically coupled to the first yoke main body 12, and have a function of guiding to the MTJ element 15 a magnetic flux generated by a write current flowing through the word line 13.

FIGS. 3 to 9 are sectional views showing the steps in manufacturing the magnetic memory device according to the first embodiment of the present invention. A magnetic memory device manufacturing method according to the first embodiment will be described.

Figure 3:
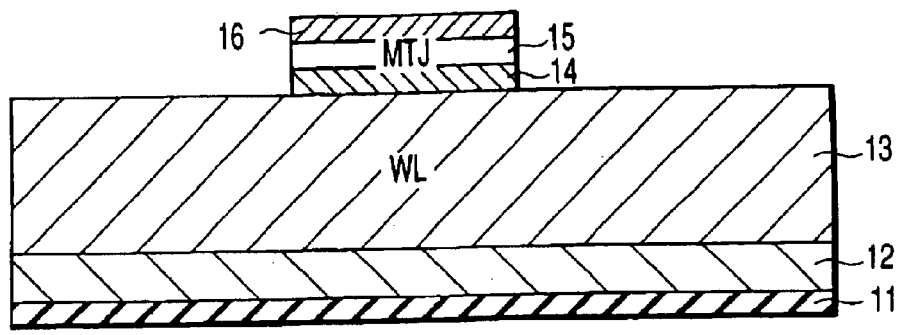

As shown in FIG. 3, a word line 13 covered with a first yoke main body 12 on the lower surface and two side surfaces is formed on an insulating film 11. An MTJ element 15 sandwiched between upper and upper metal layers 14 and 16 is formed on the word line 13.

The word line 13 and MTJ element 15 are electrically connected. The word line 13 and MTJ element 15 may be electrically insulated, and a read word line may be separately formed (e.g., FIGS. 26A and 26B).

Figure 4:
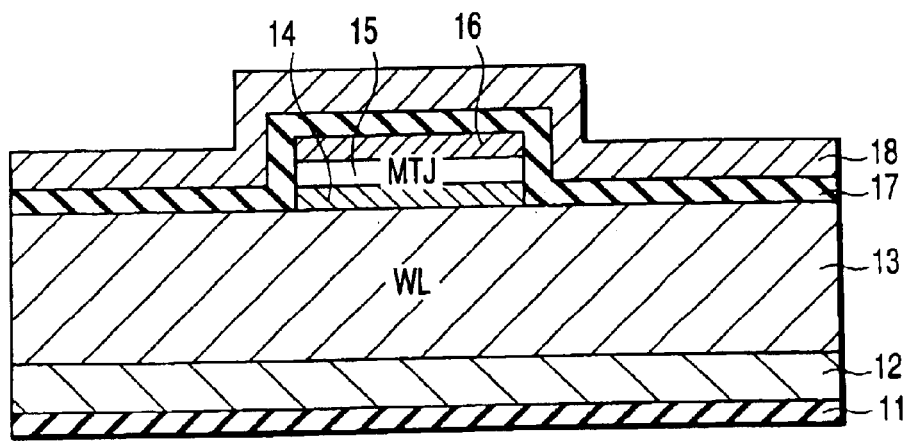

As shown in FIG. 4, an insulating film 17 of $SiN_x$ or the like is formed on the upper metal layer 16 and word line 13, and a magnetic film 18 of NiFe or the like is formed on the insulating film 17.

Figure 5:
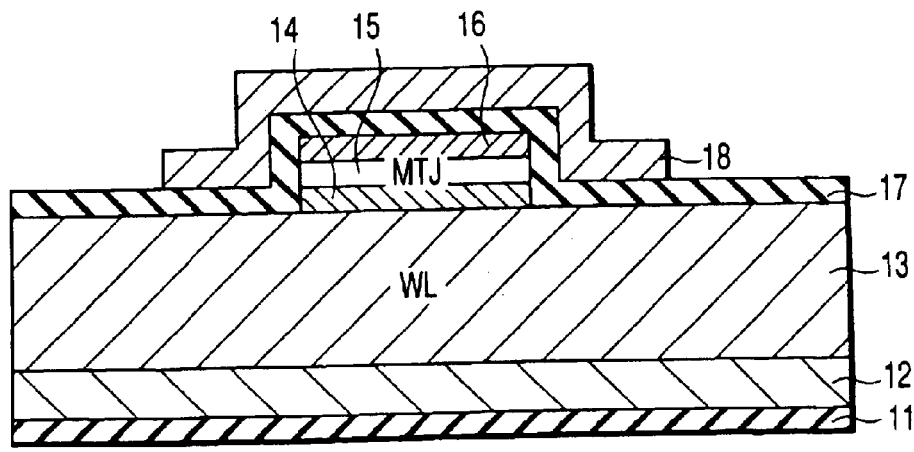
Figure 10:
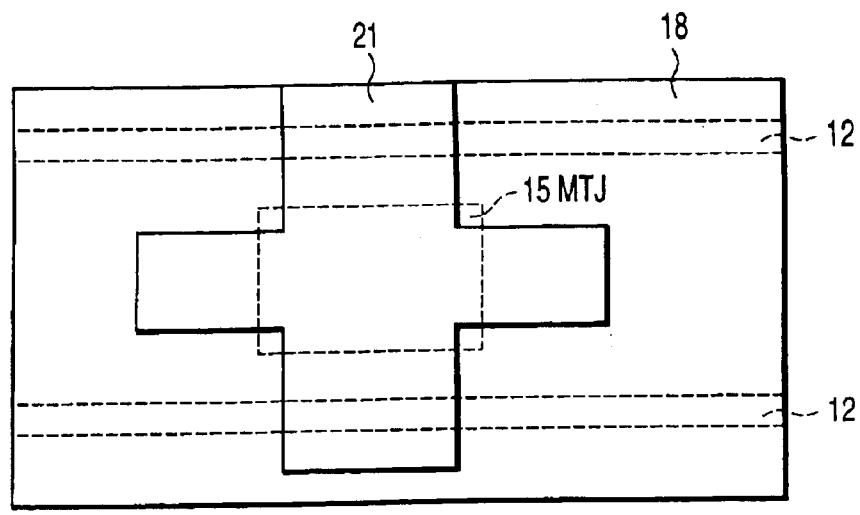
FIG. 10 is a plan view showing an etching mask used in the step of FIG. 5 according to the first embodiment of the present invention.
Figure 11:
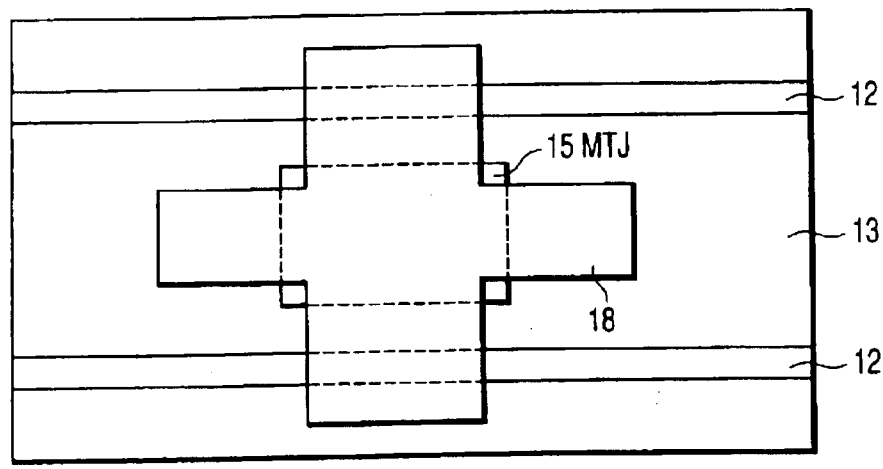
FIG. 11 is a plan view showing the shape of a magnetic film after patterning in the step of FIG. 5 according to the first embodiment of the present invention.

As shown in FIG. 5, the magnetic film 18 is patterned into a desired shape. At this time, the magnetic film 18 is patterned into a cross shape as shown in FIG. 11 by using an etching mask 21 made of a resist, Ta, or the like as shown in FIG. 10.

Figure 6:
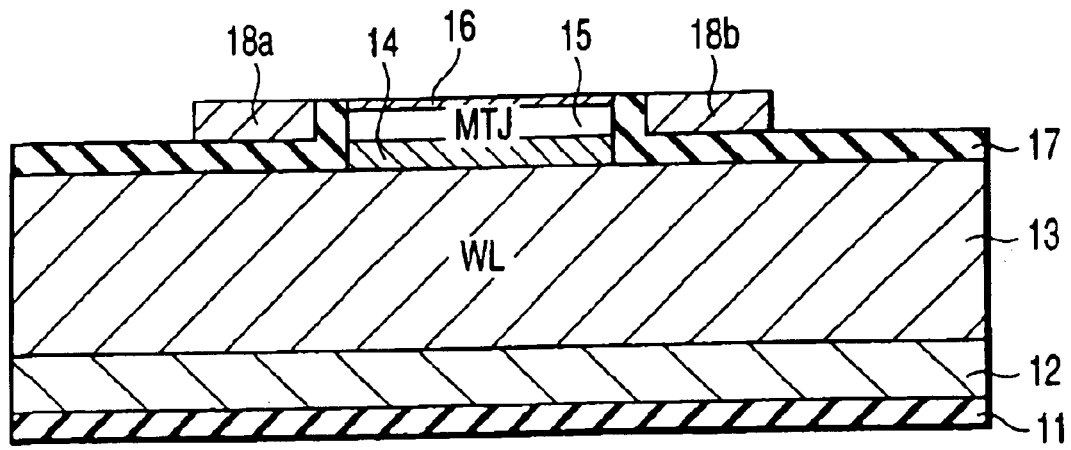

As shown in FIG. 6, the magnetic film 18, insulating film 17, and part of the upper metal layer 16 on the MTJ element 15 are removed by etch-back, CMP (Chemical-Mechanical Polishing), or the like. As a result, a shown in FIG. 12, first, second, third, and fourth yoke tips 18a, 18b, 18c, and 18d are formed in self-alignment at an interval from the MTJ element 15 by the film thickness of the insulating film 17.

In this case, etch-back is more desirable because higher-precision control can be achieved by applying and etching back a low-molecular-weight planarization material, compared to CMP.

Figure 7:
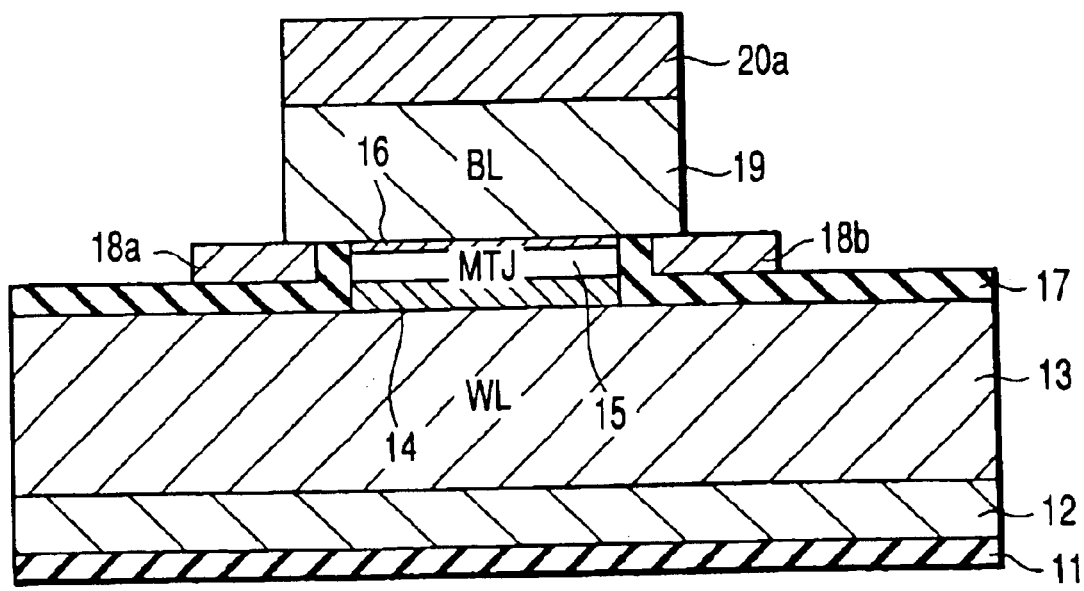

As shown in FIG. 7, a bit line 19 made of Cu or the like is formed, and a magnetic film 20a made of NiFe or the like is formed on the bit line 19.

As shown in FIG. 8, a magnetic film 20b is formed on the insulating film 17, the first, second, third, and fourth yoke tips 18a, 18b, 18d, and 18d, and the magnetic film 20a.

As shown in FIG. 9, the entire surface is ion-etched, removing the magnetic film 20b from the magnetic film 20a and insulating film 17. Consequently, a second yoke main body 20 which covers the upper and side surfaces of the bit line 19 is formed.

According to the first embodiment, (1) the third and fourth yoke tips 18c and 18d magnetically coupled to the first yoke main body 12, and the first and second yoke tips 18a and 18b magnetically coupled to the second yoke main body 20 are formed. (2) The first, second, third, and fourth yoke tips 18a, 18b, 18c, and 18d are formed in self-alignment with the MTJ element 15. The arrangements (1) and (2) yield the following effects.

With the arrangement (1), (1-a) the write current can be reduced to ⅕ that of the conventional wiring with a yoke. (1-b) The disturb (erroneous write in a half-selected cell) can be prevented, and (1-c) variations in read signal can be greatly reduced. The effects (1-a), (1-b), and (1-c) will be described in detail.

(1-a) When the cell width of the MTJ element 15 is 0.4 $\mu$m, its cell length is 1.2 $\mu$m, and the interval between the MTJ element 15 and the word line 13 is 150 nm, an NiFe film about 5 nm thick is adopted for the recording layer of the MTJ element 15. In this case, the current necessary for data write is about 10 mA on average in the conventional wiring without any yoke, and about 5 mA in the conventional wiring with a yoke shown in FIG. 54. This is because a misalignment of about 150 nm at maximum caused by variations in the interval between the word line 13 and the MTJ element 15 within the wafer makes it difficult to decrease the current.

To the contrary, the first embodiment of the present invention can reduce the current value necessary for data write to about 1 mA. This is because the intervals between the MTJ element 15 and the yoke tips 18a, 18b, 18c, and 18d can be decreased to about an alignment error (50 to 100 nm). The magnetic fluxes of the yoke main bodies 12 and 20 can be efficiently guided to the MTJ element 15 via the yoke tips 18a, 11b, 18c, and led. The yoke tips 18a, 18b, 18c, and 18d can be formed on the flat surface of the insulating film 17, and a high-quality magnetic film 18 can be formed. A high-permeability material can be used as the magnetic film 18, reducing the high-frequency write current.

(1-b) Pluralities of bit lines and word lines are laid out in a matrix, and MTJ elements are arranged at the nodes between the bit lines and the word lines. In this case, data may be written not only in one MTJ element at the node between a selected bit line and a selected word line but also in MTJ elements on one of the selected bit line and word line. This is called erroneous write in a half-selected cell (disturb).

According to the first embodiment, the magnetic fluxes of the yoke main bodies 12 and 20 can be efficiently guided to the MTJ element 15 via the yoke tips 18a, 18b, 18c, and 18d, preventing the disturb (erroneous write in a half-selected cell).

(1-c) As shown in FIGS. 14A, 14B, and 14C, resistance values "0" and "1" may vary more greatly in the use of the conventional wiring 19 with the magnetic yoke 20 than in the use of wiring without any yoke because of the following reason. A magnetic flux leaking from the remanent magnetization of the magnetic yoke 20 in the direction of wiring thickness on the side wall of the wiring 19 flows into the MTJ element 15. The magnetization of the recording layer of the MTJ element 15 tilts from a perfect "0" or "1" state, and the hysteresis curve shifts right. In the "0" state (magnetization directions of upper and lower magnetic layers are parallel), some resistance values become high. In the "1" state (magnetization directions of the upper and lower magnetic layers are anti-parallel), some resistance values become low. As a result, a read error may occur in the use of the conventional wiring with a yoke.

Figure 15A:
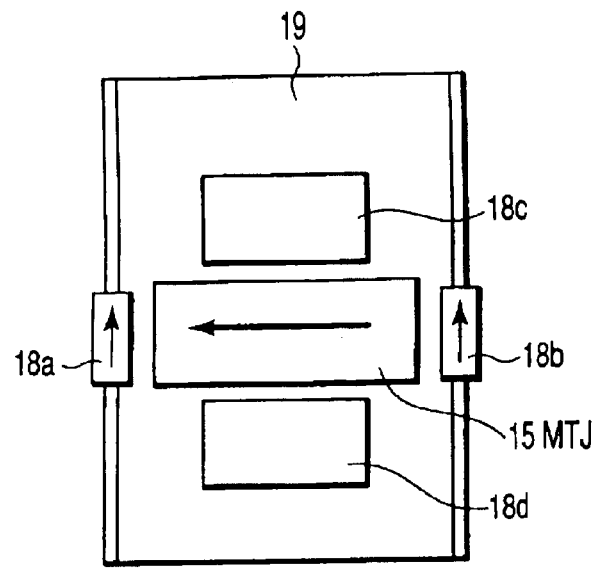
FIG. 15A is a plan view showing the magnetic memory device according to the first embodiment of the present invention.
Figure 15B:
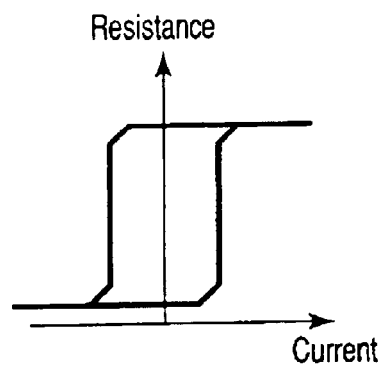
FIG. 15B is a graph showing a hysteresis curve according to the first embodiment of the present invention.
Figure 15C:
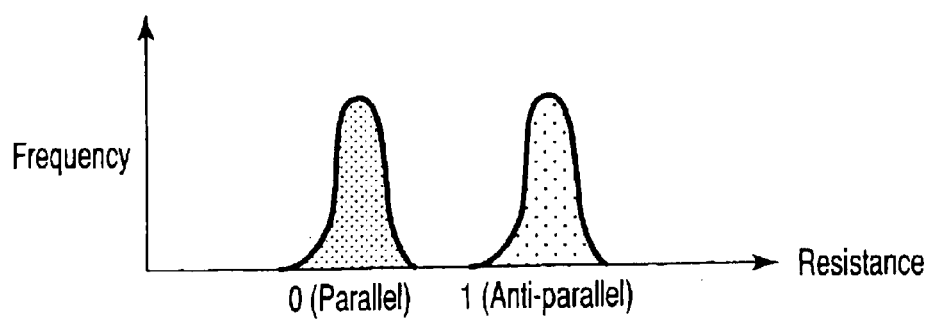
FIG. 15C is a graph showing a read signal according to the first embodiment of the present invention.

In the first embodiment, variations in resistance value can be reduced to the same degree as those in wiring without any yoke. This is because generation of remanent magnetization of the magnetic yoke in the direction of wiring thickness on the side wall of the wiring can be suppressed with a very high demagnetizing coefficient (up to 1) of the yoke tips 18a and 18b in the direction of thickness, as shown in FIGS. 15A, 15B, and 15C. The shape of the yoke tips 18a and 18b are elongated in the direction of wiring length (high aspect ratio). The remanent magnetization directions of the yoke tips 18a and 18b coincide with their long direction, and the influence on the MTJ element 15 can be ignored. The magnetization of the recording layer of the MTJ element 15 does not tilt from the "0" or "1" state, preventing right shift of the hysteresis curve. In this manner, the first embodiment can suppress variations in the resistance values of the "0" and "1" states and prevent any read error.

With the arrangement (2), (2-a) while the write current is reduced, cells poor in thermal agitation resistance can be improved. (2-b) The write current can be further reduced, and (2-c) variations in read signal can also be further decreased. The effects (2-a), (2-b), and (2-c) will be described in detail.

Figure 16A:
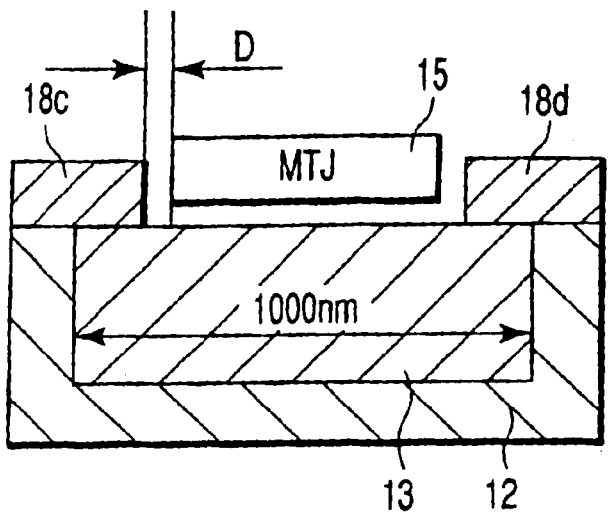
FIG. 16A is a: sectional view showing the magnetic memory device according to the first embodiment of the present invention.
Figure 16B:
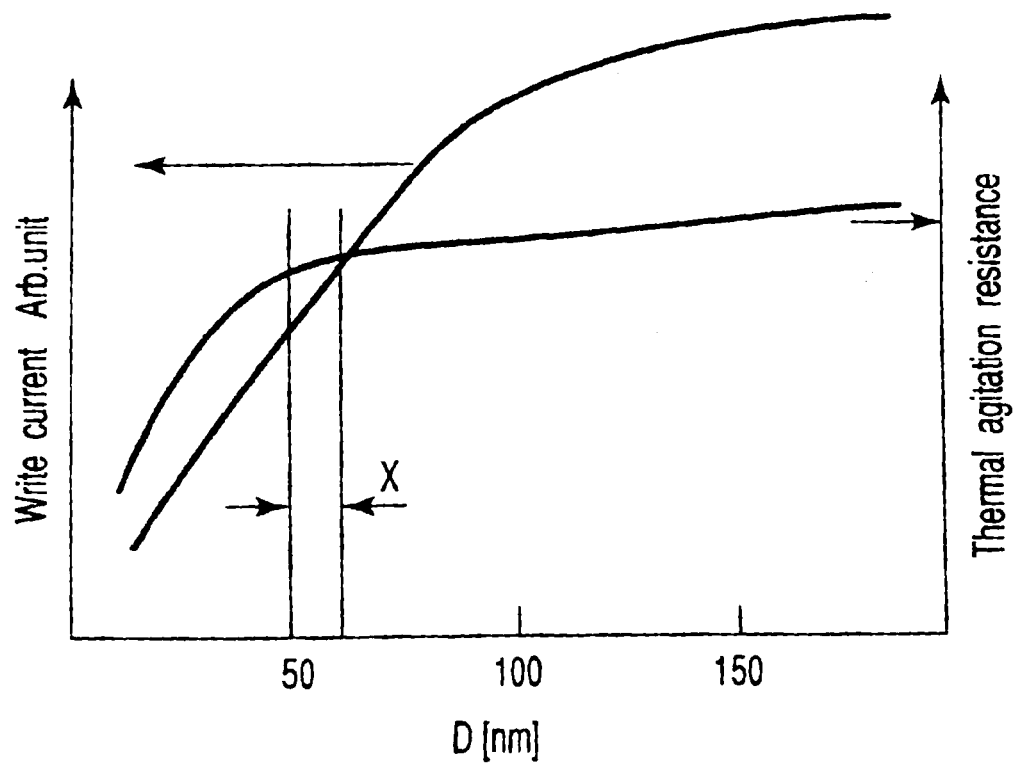
FIG. 16B is a graph showing the relationship between the write current, the thermal agitation resistance, and a distance D according to the first embodiment of the present invention.

(2-a) As shown in FIG. 16A, the distance D between the MTJ element 15 and the yoke tip 18c or 18d must be controlled to a predetermined width X at a high precision although the distance D depends on the shape and width of the MTJ element 15 to a given degree. Considering maintenance of high thermal agitation resistance, the distance D is desirably large, as shown in FIG. 16B. However, considering reduction of the write current, the distance D is desirably small. To meet these demands, the distance D must be controlled to the predetermined width X.

In this situation, according to the first embodiment, the distance D can be determined by the film thickness of the insulating film 17, and the distance D can be controlled to the predetermined width X at a high precision. Hence, cells poor in thermal agitation resistance can be improved while the write current is reduced.

(2-b) The first embodiment can prevent misalignment between the MTJ element 15 and the yoke tips 18a, 18b, 18c, and 18d by forming the MTJ element 15 and the yoke tips 18a, 18b, 18c, and 18d in self-alignment. The distances D between the MTJ element 15 and the yoke tips 18a, 18b, 18c, and 18d can be adjusted almost within the alignment allowance. The distance D can be controlled to about 20 nm±1 nm. The magnetic fluxes of the yoke main bodies 12 and 20 can be guided to the MTJ element 15 via the yoke tips 18a, 18b, 18c, and 18d at higher efficiency. The write current value can be decreased to 0.5 mA or less.

(2-c) As described above, in the first embodiment, the distances D between the MTJ element 15 and the yoke tips 18a, 18b, 18c, and 18d can be controlled by the film thickness of the insulating film 17 at a high precision (about±1 nm) in all cells. Variations in write current value which switches the magnetization of the recording layer of the cell (variations in read signal) can be greatly reduced. The margin of the write current value with respect to the disturb can be widened, further preventing the write disturb.

In the step of FIG. 6 in the first embodiment, the film is not necessarily removed until the surfaces of the first, second, third, and fourth yoke tips 18a, 18b, 18c, and 18d become flat. For example, as shown in FIG. 13, steps 22 may be left on the surfaces of the first, second, third, and fourth yoke tips 18a, 18b, 18c, and 18d by controlling the etch-back or CMP removal amount. In this case, the areas of the yoke tips 18a, 18b, 18c, and 18d in contact with the MTJ element 15 can be increased, in addition to the effects of the first embodiment. The magnetic fluxes of the yoke main bodies 12 and 20 can be more efficiently guided to the MTJ element 15, further reducing the write current.

Also, in FIGS. 2A and 2B, the lower metal layer 14 or upper metal layer 16 may be replaced by a diode layer, and the diode layer may be used as a read switching element.

Second Embodiment

In the second embodiment, the yoke tip shape in the first embodiment is modified. In the second embodiment, only a structure different from that of the first embodiment will be described.

Figure 17:
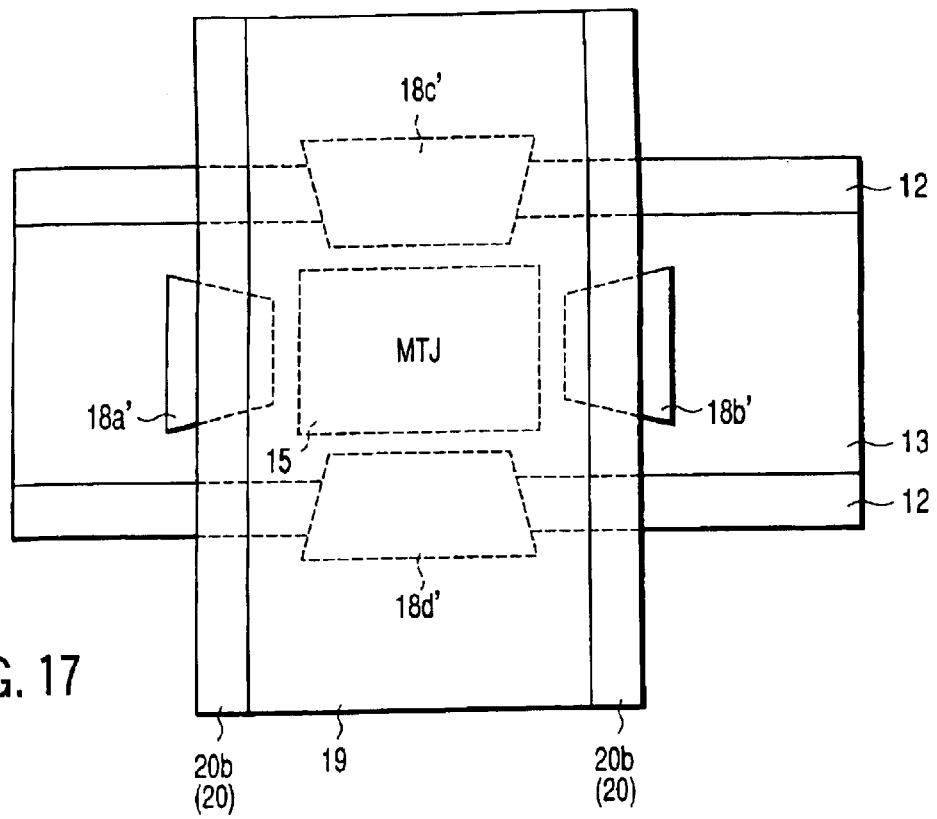
FIG. 17 is a plan view showing a magnetic memory device according to the second embodiment of the present invention.

FIG. 17 is a plan view showing a magnetic memory device according to the second embodiment of the present invention. As shown in FIG. 17, in the magnetic memory device according to the second embodiment, first, second, third, and fourth yoke tips 18a', 18b', 18c', and 18d' are tapered toward an MTJ element 15. That is, the width of the first side surface of each of the first, second, third, and fourth yoke tips 18a', 18b', 18c', and 18d' that faces the MTJ element 15 is smaller than that of the second side surface opposite to the first side surface. The first, second, third, and fourth yoke tips 18a', 18b', 18c', and 18d' have a trapezoidal planar shape.

The second embodiment can achieve the same effects as those of the first embodiment.

In the second embodiment, the first, second, third, and fourth yoke tips 18a', 18b', 18c', and 18d' are tapered toward the MTJ element 15. This structure can more efficiently guide the magnetic fluxes of yoke main bodies 12 and 20 to the MTJ element 15, further reducing the write current. More specifically, the second embodiment can reduce the write current to about 0.6 times that of the first embodiment.

Third Embodiment

In the third embodiment, the shapes of the yoke tip and MTJ element in the first embodiment are modified. In the third embodiment, only a structure different from that of the first embodiment will be described.

Figure 18:
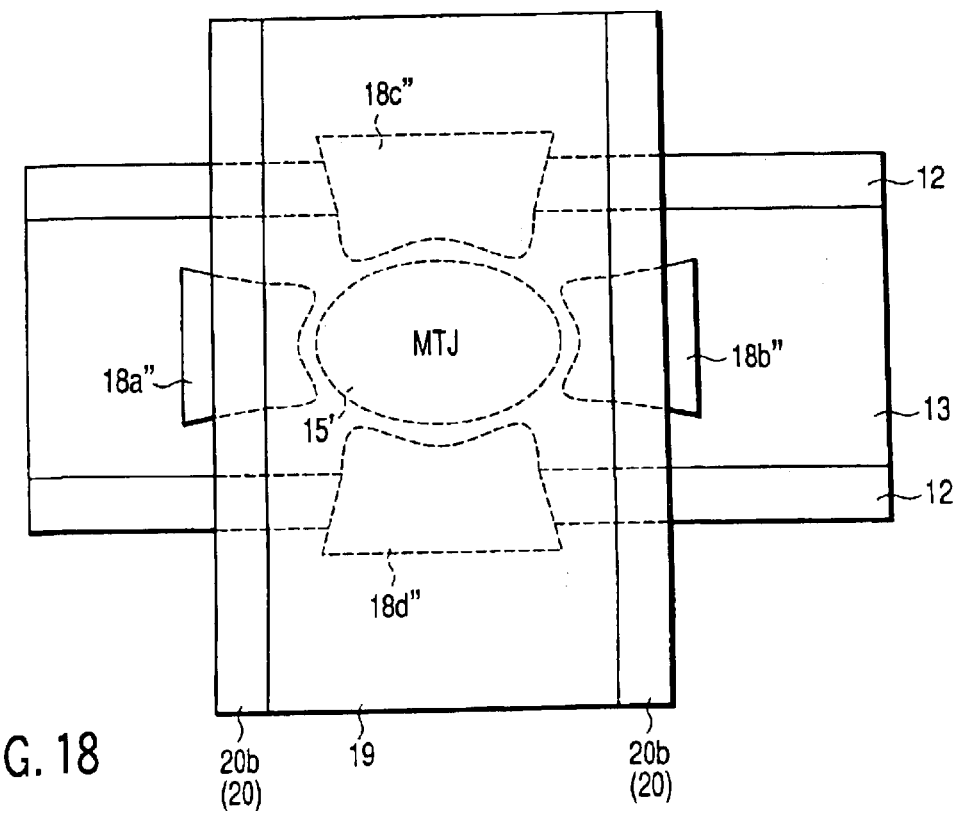
FIG. 18 is a plan view showing a magnetic memory device according to the third embodiment of the present invention.

FIG. 18 is a plan view showing a magnetic memory device according to the third embodiment of the present invention. As shown in FIG. 18, in the magnetic memory device according to the third embodiment, an MTJ element 15' has an elliptic planar shape. The inner surfaces of first, second, third, and fourth yoke tips 18a'', 18b'', 18c'', and 18d'' are curved along the shape of the MTJ element 15'. Similar to the second embodiment, the first, second, third, and fourth yoke tips 18a'', 18b'', 18c'', and 18d'' are tapered toward the MTJ element 15'.

The third embodiment can obtain the same effects as those of the first and second embodiments.

In the third embodiment, the planar shape of the MTJ element 15' is elliptic. This can prevent variations in magnetization direction at the end of the MTJ element 15' in the long direction, and suppress variations in the resistance value of the read signal.

Fourth Embodiment

In the fourth embodiment, the yoke tip in the second embodiment is modified. In the fourth embodiment, only a structure different from that of the second embodiment will be described.

Figure 19:
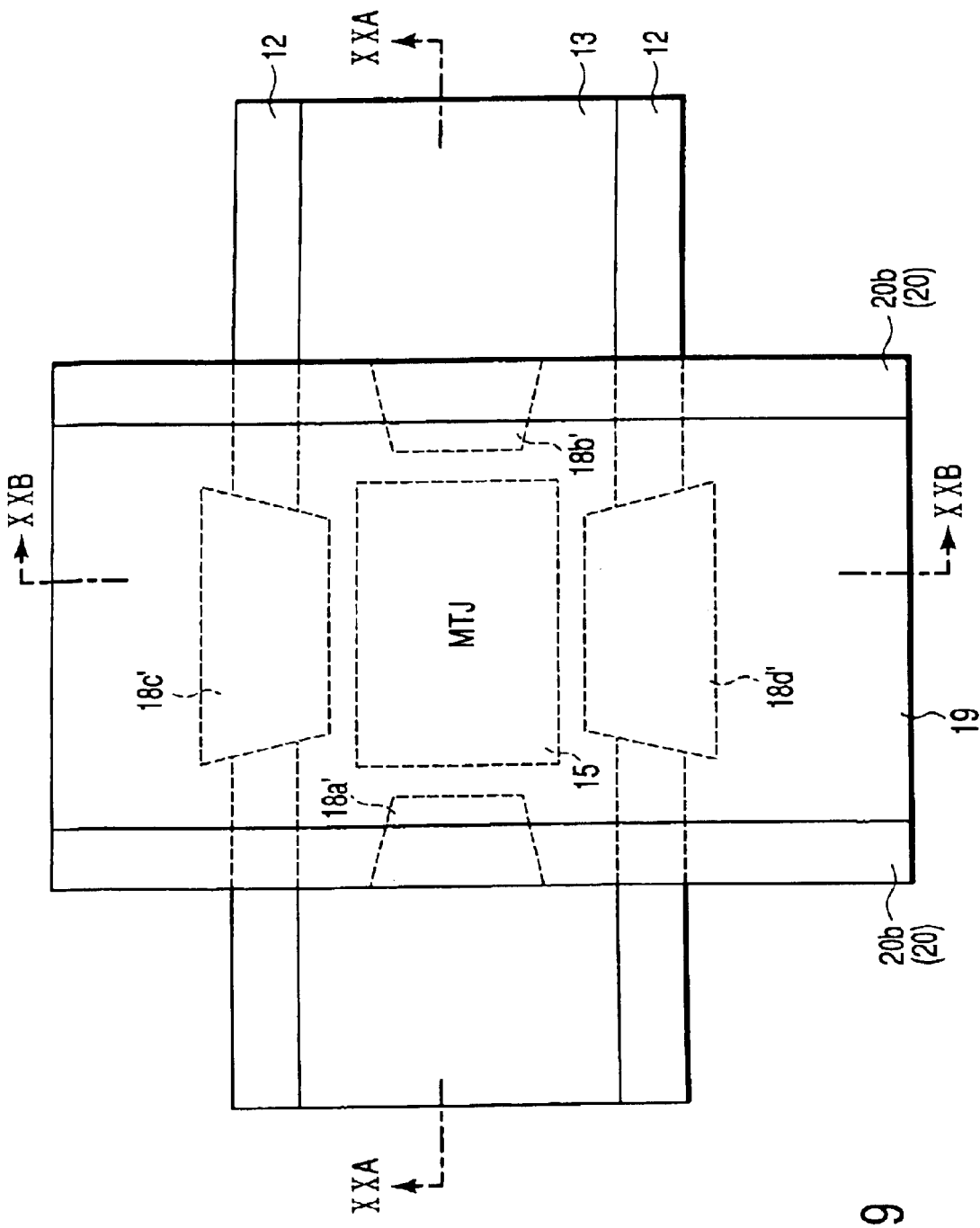
FIG. 19 is a plan view showing a magnetic memory device according to the fourth embodiment of the present invention.
Figure 20A:
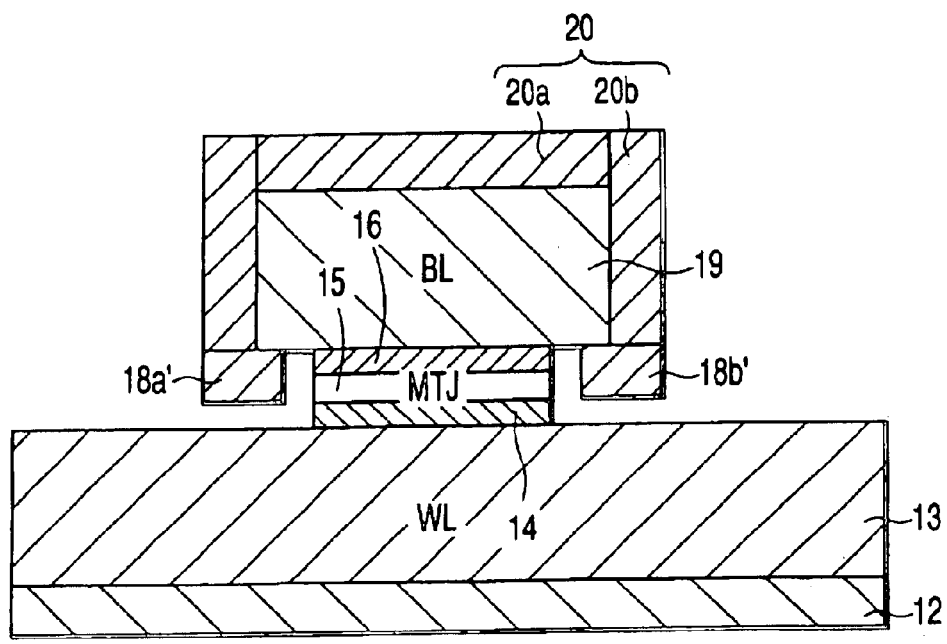
FIG. 20A is a sectional view showing the magnetic memory device taken along the line XXA—XXA in FIG. 19.
Figure 20B:
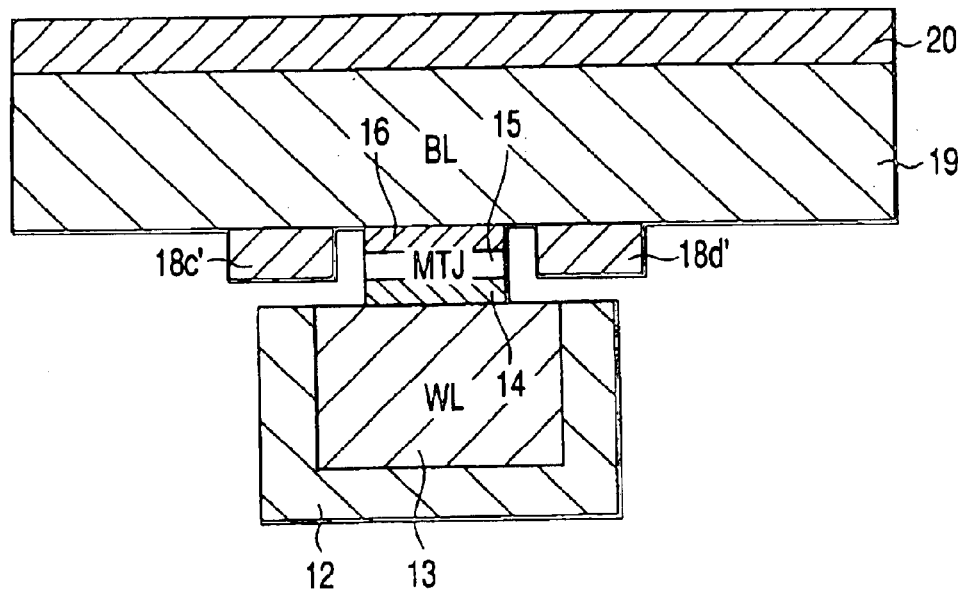
FIG. 20B is a sectional view showing the magnetic memory device taken along the line XXB—XXB in FIG. 19.

FIG. 19 is a plan view showing a magnetic memory device according to the fourth embodiment of the present invention. FIG. 20A is a sectional view showing the magnetic memory device taken along the line XXA—XXA in FIG. 19. FIG. 20B is a sectional view showing the magnetic memory device taken along the line XXB—XXB in FIG. 19.

As shown in FIGS. 19, 20A, and 20B, in the magnetic memory device according to the fourth embodiment, projections 23 (see FIG. 2A) of the first and second yoke tips 18a and 18b from the side surface of the second yoke main body 20 in the second embodiment are removed. In the fourth embodiment, the outer surfaces of first and second yoke tips 18a' and 18b' are flush with the side surface of a second yoke main body (20b) 20.

The fourth embodiment can obtain the same effects as those of the first and second embodiments.

In the fourth embodiment, the outer surfaces of the first and second yoke tips 18a' and 18b' are flush with the side surface of the second yoke main body 20 (20b). This structure can more efficiently guide the magnetic flux of the second yoke main body 20 to an MTJ element 15, further reducing the write current. More specifically, the fourth embodiment can reduce the write current value from 0.5 mA by about 10%.

In the fourth embodiment, the outer surfaces of the first and second yoke tips 18a' and 18b' are flush with the side surface of the second yoke main body 20 (20b). Furthermore, the outer surfaces of third and fourth yoke tips 18c' and 18d' may be flush with the side surface of a first yoke main body 12. In this case, in addition to the effects of the fourth embodiment, the magnetic flux of the first yoke main body 12 can be more efficiently guided to the MTJ element 15, reducing a write current flowing through a word line 13.

Fifth Embodiment

In the fifth embodiment, the yoke main body in the second embodiment is modified. In the fifth embodiment, only a structure different from that of the second embodiment will be described.

Figure 21:
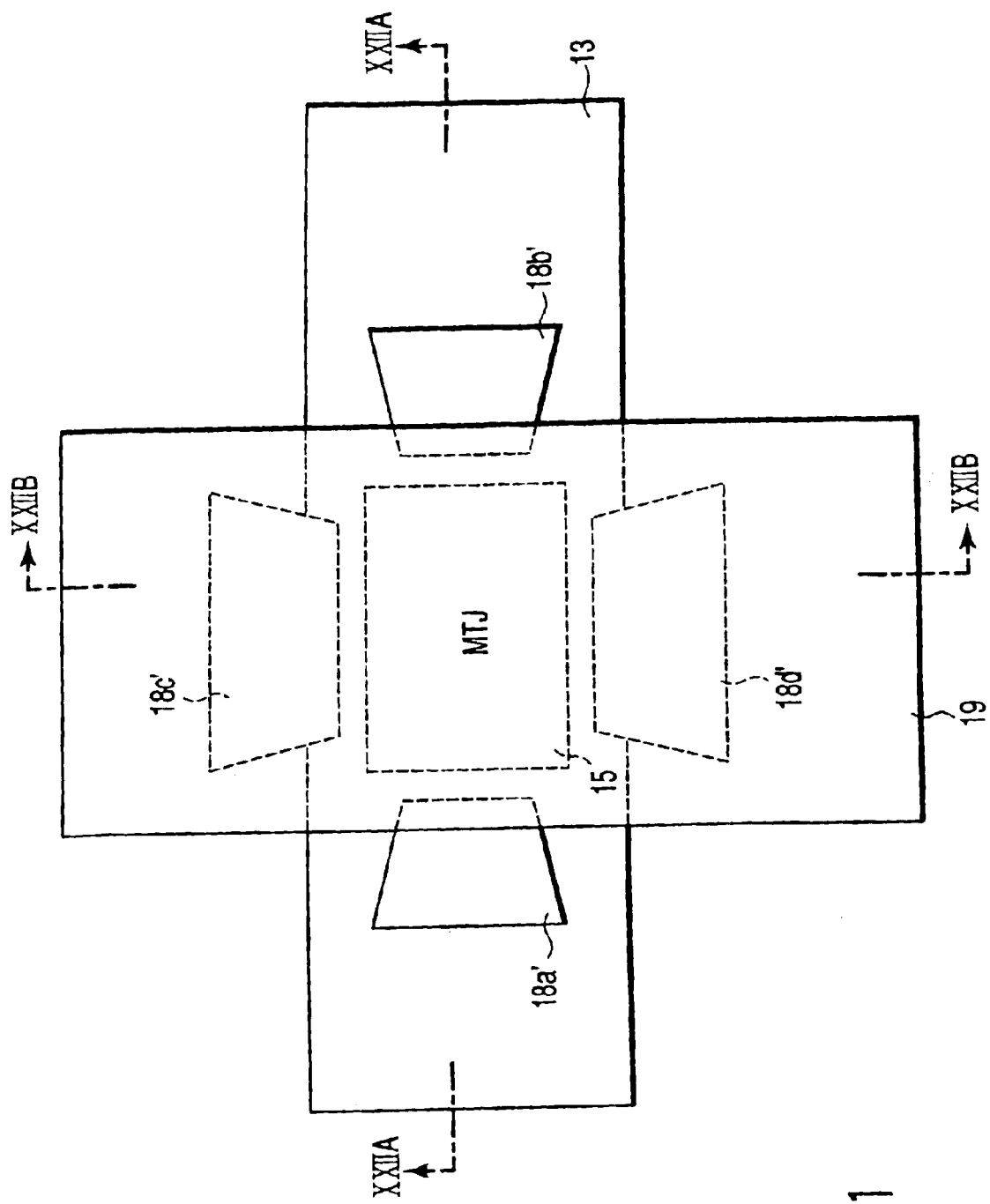
FIG. 21 is a plan view showing a magnetic memory device according to the fifth embodiment of the present invention.

FIG. 21 is a plan view showing a magnetic memory device according to the fifth embodiment of the present invention. FIG. 22A is a sectional view showing the magnetic memory device taken along the line XXIIA—XXIIA in FIG. 21. FIG. 22B is a sectional view showing the magnetic memory device taken along the line XXIIB—XXIIB in FIG. 21.

As shown in FIGS. 21, 22A, and 22B, in the magnetic memory device according to the fifth embodiment, a first yoke main body 12 is not formed on the two sides of a word line 13, and a second yoke main body 20 is not formed on the two sides of a bit line 19. In the fifth embodiment, the first yoke main body 12 is formed only below the word line 13, and the second yoke main body 20 is formed only on the bit line 19.

The fifth embodiment can achieve the same effects as those of the first and second embodiments.

The fifth embodiment can decrease the number of processes because no yoke main bodies 12 and 20 are formed on the two sides of each of the word line 13 and bit line 19.

In the fifth embodiment, the magnetic fluxes of the yoke main bodies 12 and 20 can be efficiently guided to the MTJ element 15 without forming the yoke main bodies 12 and 20 on the two sides of each of the word line 13 and bit line 19 as long as first and second yoke tips 18a' and 18b' are magnetically coupled to the second yoke main body 20 while third and fourth yoke tips 18c' and 18d' are magnetically coupled to the first yoke main body 12.

Sixth Embodiment

In the sixth embodiment, the yoke main body in the second embodiment is modified. In the sixth embodiment, only a structure different from that of the second embodiment will be described.

Figure 23:
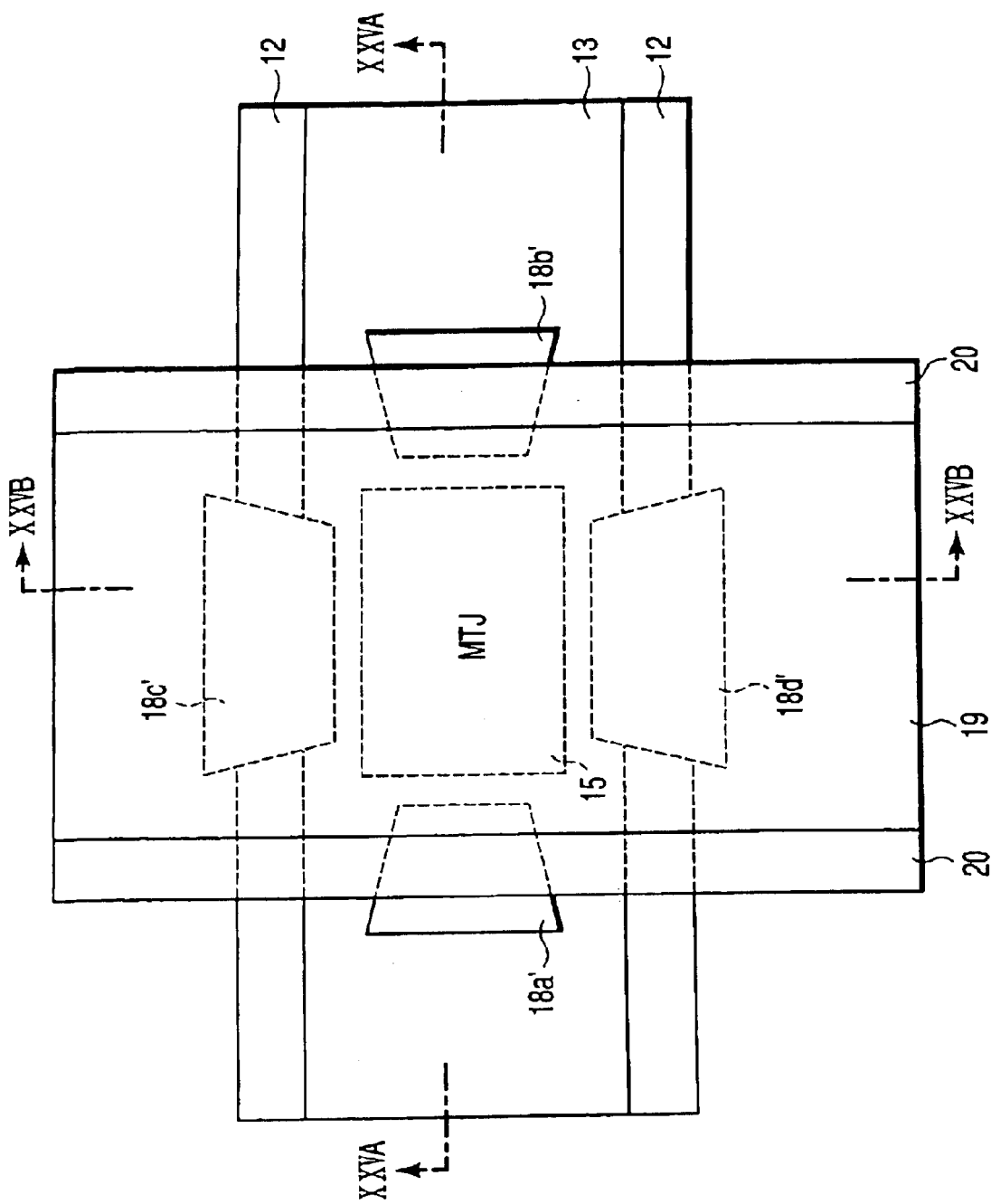
FIG. 23 is a plan view showing a magnetic memory device according to the sixth embodiment of the present invention.

FIG. 23 is a plan view showing a magnetic memory device according to the sixth embodiment of the present invention. FIG. 24A is a sectional view showing the magnetic memory device taken along the line XXIVA—XXIVA in FIG. 23. FIG. 24B is a sectional view showing the magnetic memory device taken along the line XXIVB—XXIVB in FIG. 23.

As shown in FIGS. 23, 24A, and 24B, in the magnetic memory device according to the sixth embodiment, a first yoke main body 12 is not formed below a word line 13, and a second yoke main body 20 is not formed on a bit line 19. In the sixth embodiment, the first yoke main body 12 is formed only on the two sides of the word line 13, and the second yoke main body 20 is formed only on the two sides of the bit line 19.

The sixth embodiment can obtain the same effects as those of the first and second embodiments.

The sixth embodiment can decrease the number of processes because no yoke main bodies 12 and 20 are formed below the word line 13 and on the bit line 19.

Seventh Embodiment

The seventh embodiment adopts a read selector transistor for the second embodiment. In the seventh embodiment, only a structure different from that of the second embodiment will be described.

Figure 25:
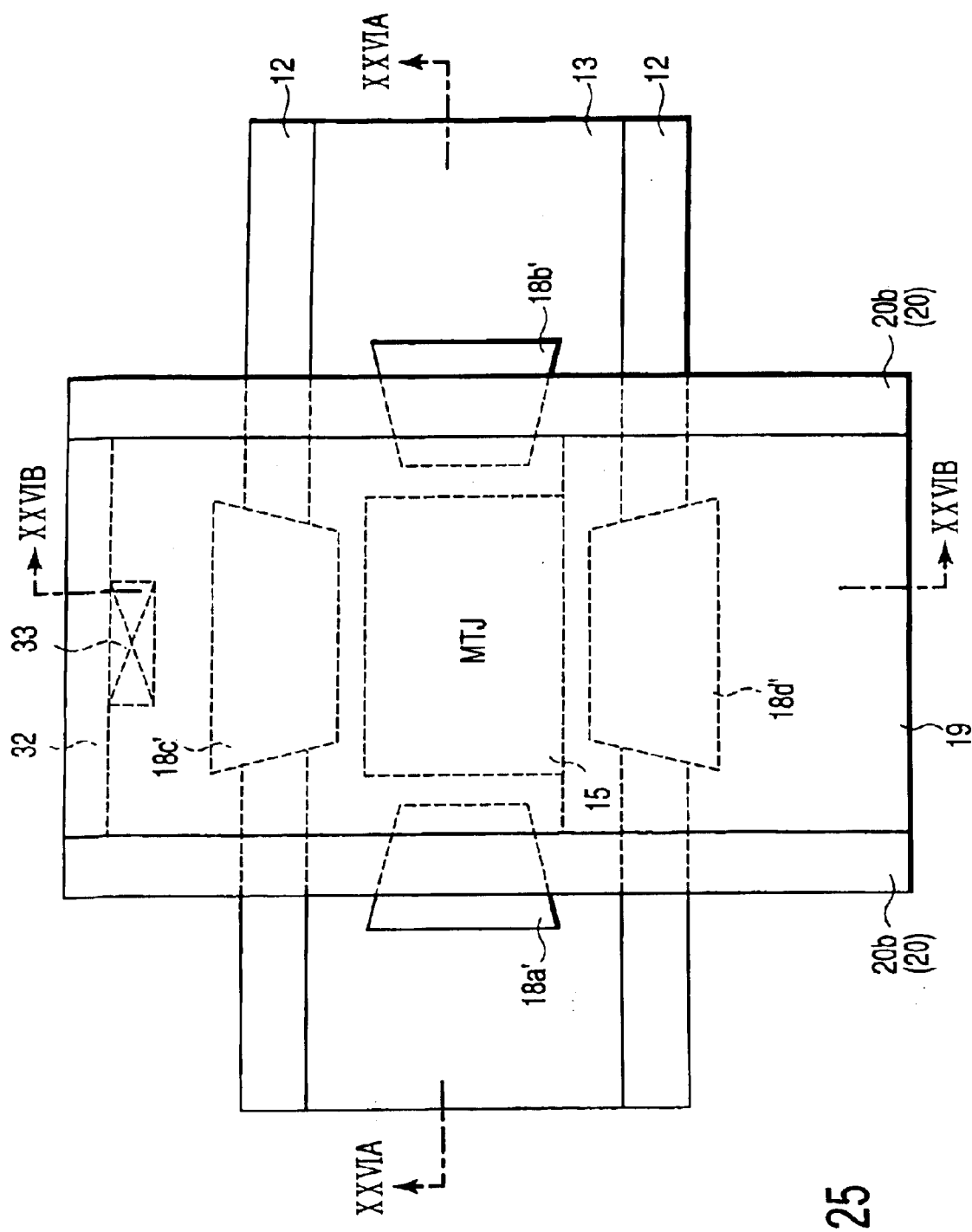
FIG. 25 is a plan view showing a magnetic memory device according to the seventh embodiment of the present invention.
Figure 26A:
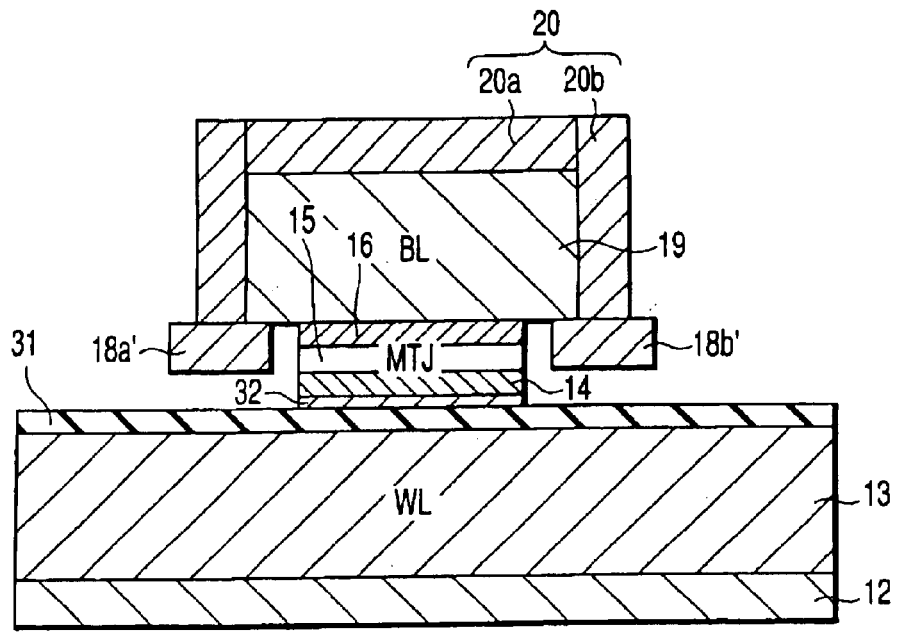
FIG. 26A is a sectional view showing the magnetic memory device taken along the line XXVIA—XXVIA in FIG. 25.
Figure 26B:
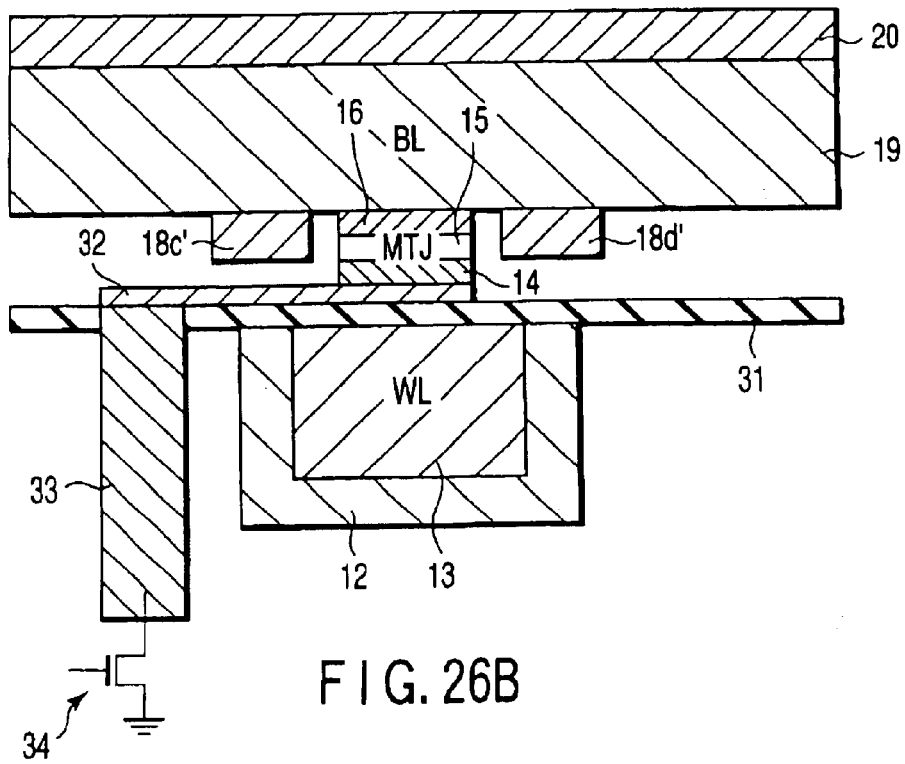
FIG. 26B is a sectional view showing the magnetic memory device taken along the line XXVIB—XXVIB in FIG. 25.

FIG. 25 is a plan view showing a magnetic memory device according to the seventh embodiment of the present invention. FIG. 26A is a sectional view showing the magnetic memory device taken along the line XXVIA—XXVIA in FIG. 25. FIG. 26B is a sectional view showing the magnetic memory device taken along the line XXVIB—XXVIB in FIG. 25.

As shown in FIGS. 25, 26A, and 26B, in the magnetic memory device according to the seventh embodiment, an extraction metal layer 32 is formed below an MTJ element 15, and connected to a read cell selection transistor 34 via a contact 33. To insulate a word line 13 and the MTJ element 15, an insulating film 31 is formed between the metal layer 32 and the word line 13. In this structure, the word line 13 functions as a write word line, and the gate electrode of the transistor 34 functions as a read word line.

The seventh embodiment can obtain the same effects as those of the first and second embodiments.

The seventh embodiment can supply a read current to only a selected cell because of the presence of the read selector transistor 34. The S/N ratio of the read signal can be increased, resulting in a high read speed.

In the seventh embodiment, a diode can be employed as a read switching element instead of the transistor 34.

Eighth Embodiment

In the eighth embodiment, the word line 13 and MTJ element 15 in the seventh embodiment are not insulated. In the eighth embodiment, only a structure different from that of the first embodiment will be described.

Figure 27:
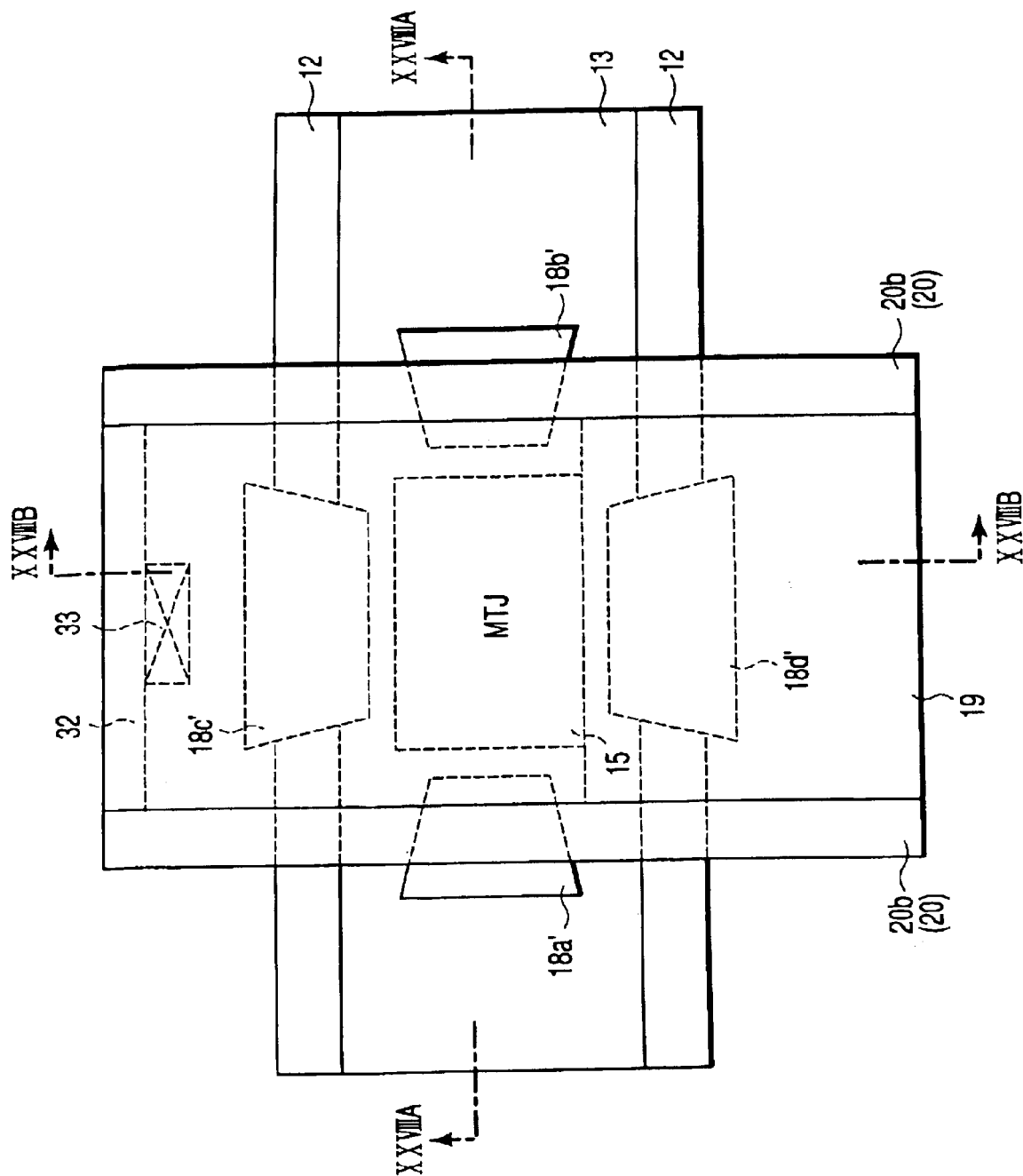
FIG. 27 is a plan view showing a magnetic memory device according to the eighth embodiment of the present invention.
Figure 28A:
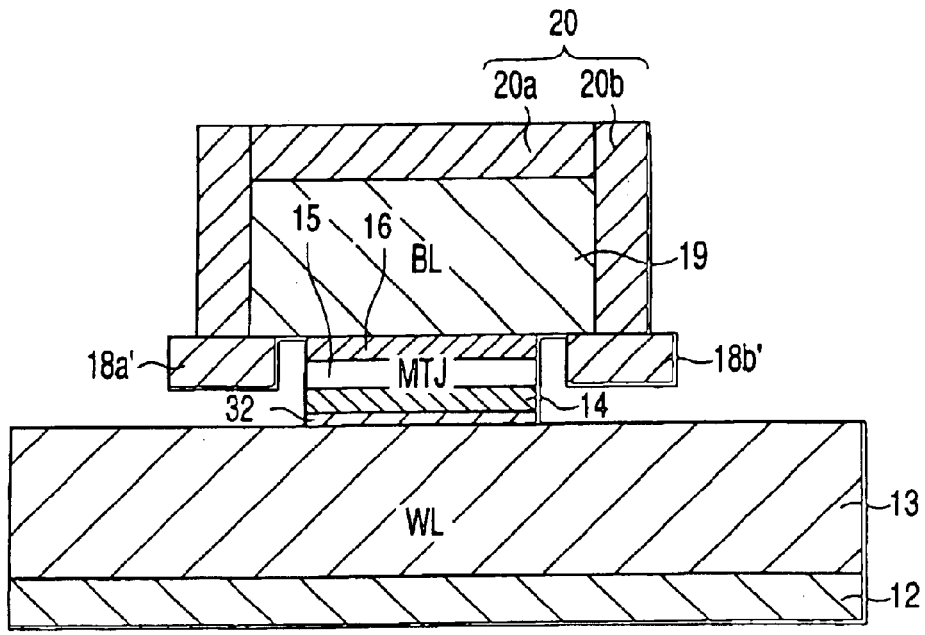
FIG. 28A is a sectional view showing the magnetic memory device taken along the line XXVIIIA—XXVIIIA in FIG. 27.
Figure 28B:
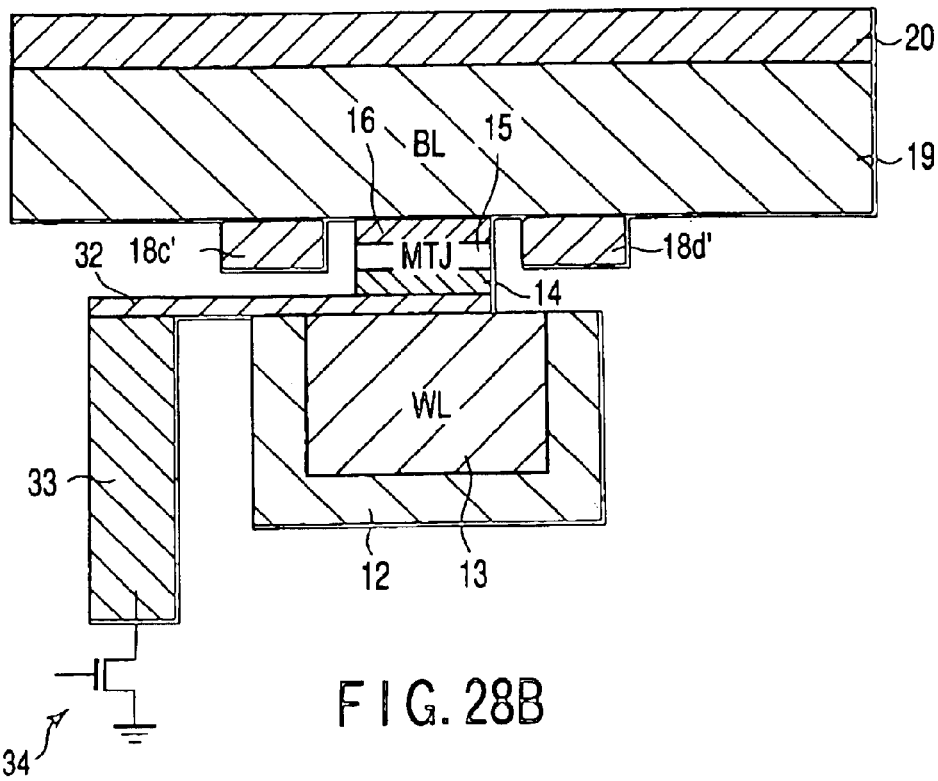
FIG. 28B is a sectional view showing the magnetic memory device taken along the line XXVIIIB—XXVIIIB in FIG. 27.

FIG. 27 is a plan view showing a magnetic memory device according to the eighth embodiment of the present invention. FIG. 28A is a sectional view showing the magnetic memory device taken along the line XXVIIIA—XXVIIIA in FIG. 27. FIG. 28B is a sectional view showing the magnetic memory device taken along the line XXVIIIB—XXVIIIB in FIG. 27.

As shown in FIGS. 27, 28A, and 28B, in the magnetic memory device according to the eighth embodiment, the word line 13 and MTJ element 15 in the seventh embodiment are not insulated. Hence, a metal layer 32 and word line 13 are in contact with each other.

The eighth embodiment can attain the same effects as those of the first and second embodiments.

In the eighth embodiment, a first yoke main body 12 can be formed closer to third and fourth yoke tips 18c' and 18d' than that of the seventh embodiment because of the absence of any insulating film between the word line 13 and the metal layer 32. The magnetic flux of a first yoke main body 12 can be more efficiently guided to an MTJ element 15, further reducing the write current.

In the eighth embodiment, a diode can be employed as a read switching element instead of a transistor 34.

Ninth Embodiment

In the ninth embodiment, the third and fourth yoke tips in the eighth embodiment are in contact with the first yoke main body. In the ninth embodiment, only a structure different from that of the eighth embodiment will be described.

Figure 29:
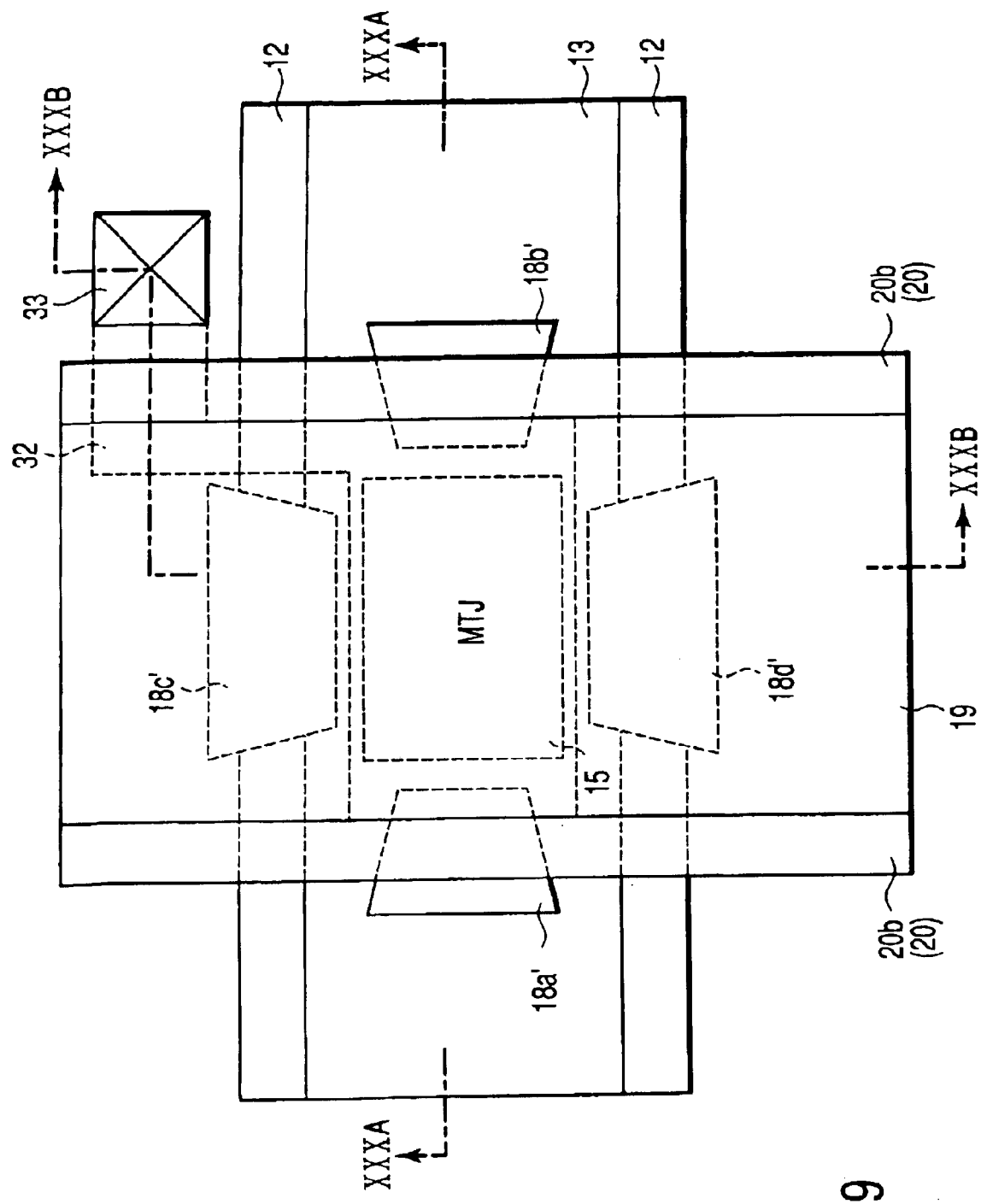
FIG. 29 is a plan view showing a magnetic memory device according to the ninth embodiment of the present invention.
Figure 30A:
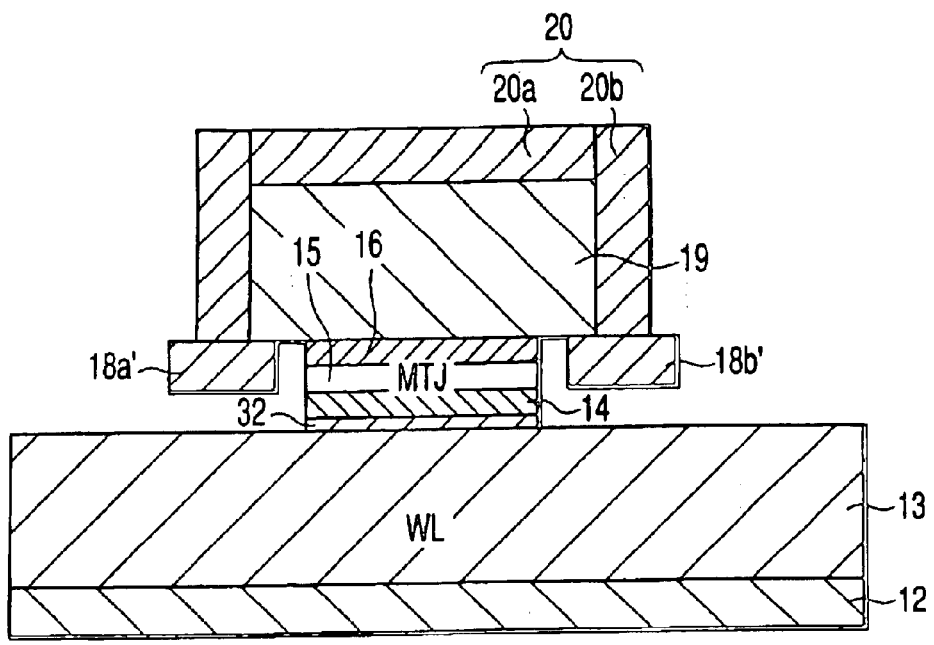
FIG. 30A is a sectional view showing the magnetic memory device taken along the line XXXA—XXXA in FIG. 29.
Figure 30B:
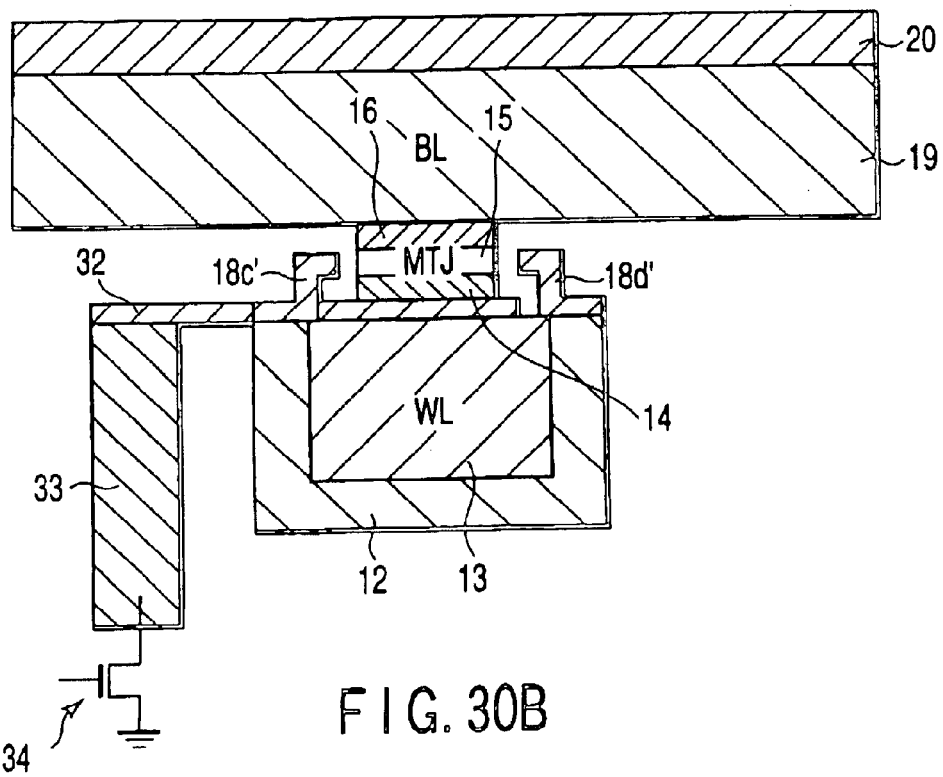
FIG. 30B is a sectional view showing the magnetic memory device taken along the line XXXB—XXXB in FIG. 29.

FIG. 29 is a plan view showing a magnetic memory device according to the ninth embodiment of the present invention. FIG. 30A is a sectional view showing the magnetic memory device taken along the line XXXA—XXXA in FIG. 29. FIG. 30B is a sectional view showing the magnetic memory device taken along the line XXXB—XXXB in FIG. 29.

As shown in FIGS. 29, 30A, and 30B, in the magnetic memory device according to the ninth embodiment, third and fourth yoke tips 18c' and 18d' are formed closer to a first yoke main body 12 by deforming a metal layer 32. The third and fourth yokes 18c' and 18d' can contact the first yoke main body 12.

The ninth embodiment can attain the same effects as those of the eighth embodiment.

In the ninth embodiment, the third and fourth yoke tips 18c' and 18d' are in contact with the first yoke main body 12. The magnetic flux of the first yoke main body 12 can be more efficiently guided to an MTJ element 15 than in the eighth embodiment, further reducing the write current.

A contact 33 which connects the MTJ element 15 and a transistor 34 is arranged outside a bit line 19, but may be arranged below the bit line 19.

The third and fourth yoke tips 18c and 18d need not always contact the first yoke main body 12, but may have a small gap from the first yoke main body 12.

In the ninth embodiment, a diode can be employed as a read switching element instead of the transistor 34.

10th Embodiment

In the 10th embodiment, an array with a matrix structure without using any read switching element comprises a read-only word line. In the 10th embodiment, only a structure different from that of the second embodiment will be described.

Figure 31:
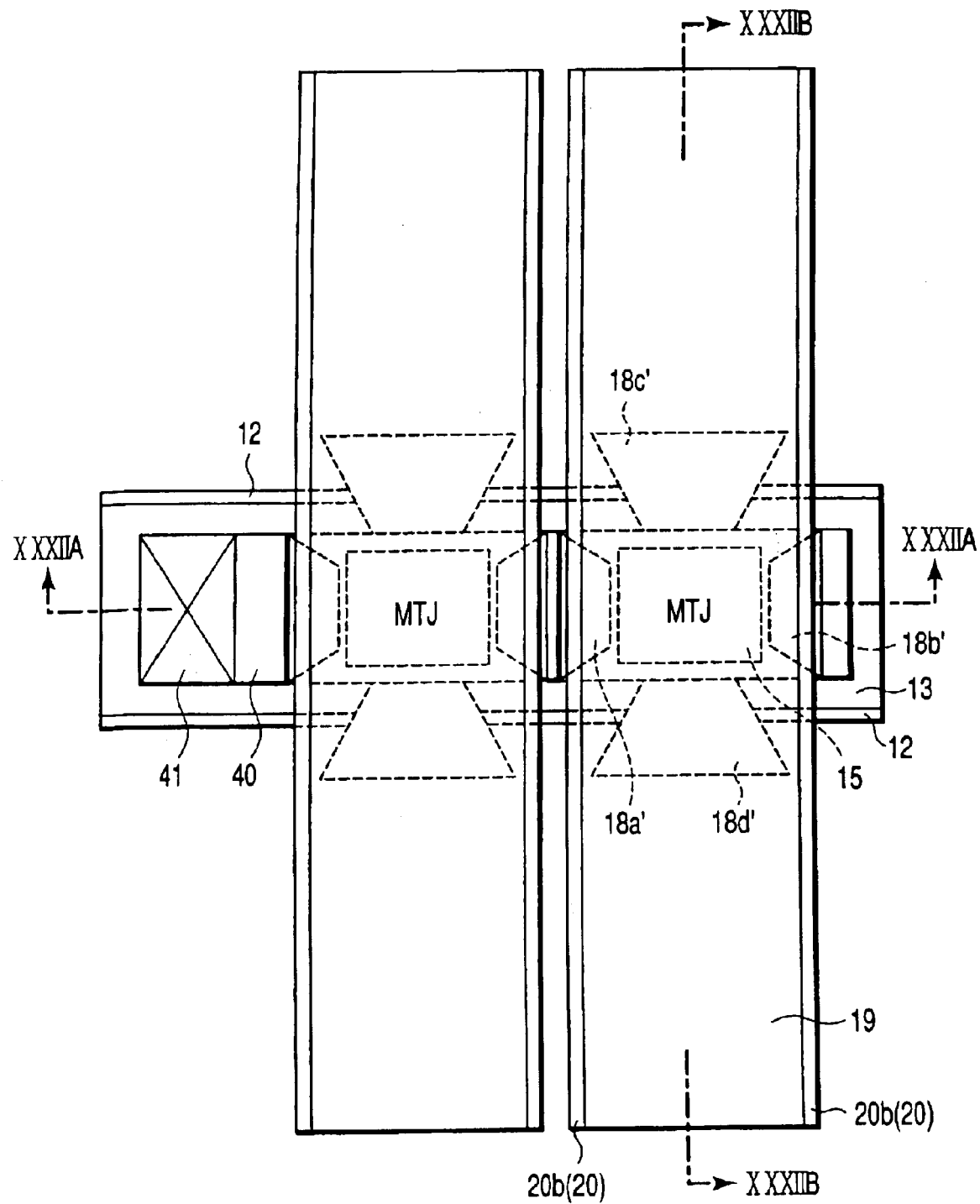
FIG. 31 is a plan view showing a magnetic memory device according to the 10th embodiment of the present invention.

FIG. 31 is a plan view showing a magnetic memory device according to the 10th embodiment of the present invention. FIG. 32A is a sectional view showing the magnetic memory device taken along the line XXXIIA—XXXIIA in FIG. 31. FIG. 32B is a sectional view showing the magnetic memory device taken along the line XXXIIB—XXXIIB in FIG. 31.

As shown in FIGS. 31, 32A, and 32B, in the magnetic memory device according to the 10th embodiment, a plurality of MTJ elements 15 are connected to a read word line 42 via a metal layer 40 and contact 41. A word line 13 and bit line 19 function as write wiring. To insulate the MTJ element 15 and word line 13, the word line metal layer 40 is spaced apart from the word line 13. Third and fourth yoke tips 18c' and 18d' are in contact with a first yoke main body 12. The MTJ element 15 is in contact with the bit line 19, but spaced apart from the word line 13.

The 10th embodiment can obtain the same effects as those of the first and second embodiments.

In the 10th embodiment, the third and fourth yoke tips 18c' and 18d' are in contact with the first yoke main body 12. Hence, the magnetic flux of the first yoke main body 12 can be more efficiently guided to the MTJ element 15, further reducing the write current.

11th Embodiment

In the 11th embodiment, an insulating film mask is used for patterning a magnetic film in the magnetic memory device manufacturing method of the first embodiment.

Figure 33:
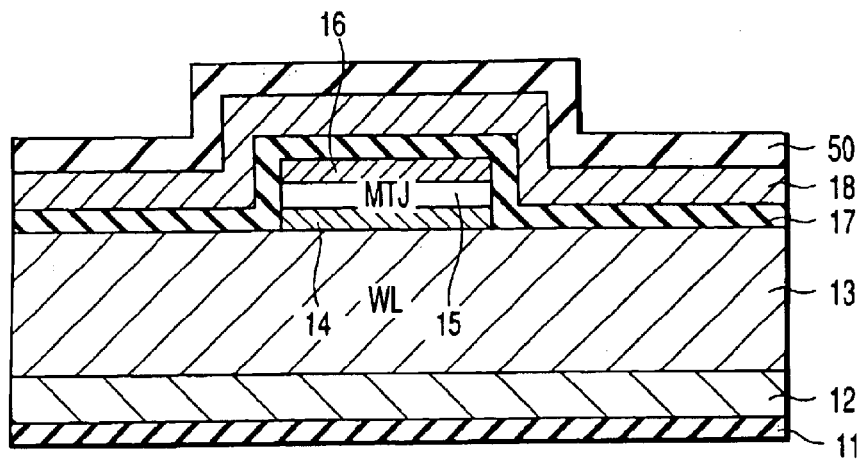
FIG. 33 is a sectional view showing the step subsequent to FIG. 4 in manufacturing a magnetic memory device according to the 11th embodiment of the present invention.
Figure 34:
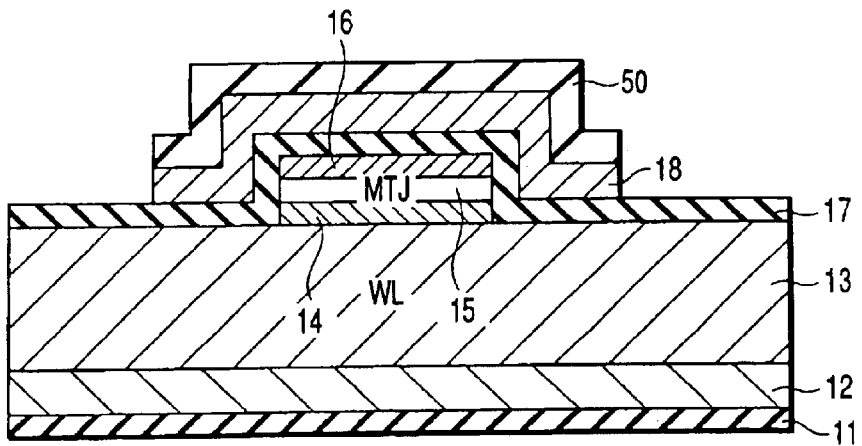
FIG. 34 is a sectional view showing the step subsequent to FIG. 33 in manufacturing the magnetic memory device according to the 11th embodiment of the present invention.

FIGS. 33 and 34 are sectional views showing the steps in manufacturing a magnetic memory device according to the 11th embodiment of the present invention. The magnetic memory device manufacturing method according to the 11th embodiment will be explained. In the 11th embodiment, a description of the same steps as those in the magnetic memory device manufacturing method of the first embodiment will be simplified.

As shown in FIGS. 1 to 4, similar to the first embodiment, an MTJ element 15 sandwiched between lower and upper metal layers 14 and 16 is formed on a word line 13. After that, an insulating film 17 and magnetic film 18 are sequentially formed.

As shown in FIG. 33, a mask layer 50 is formed from an insulating film on the magnetic film 18.

Figure 35:
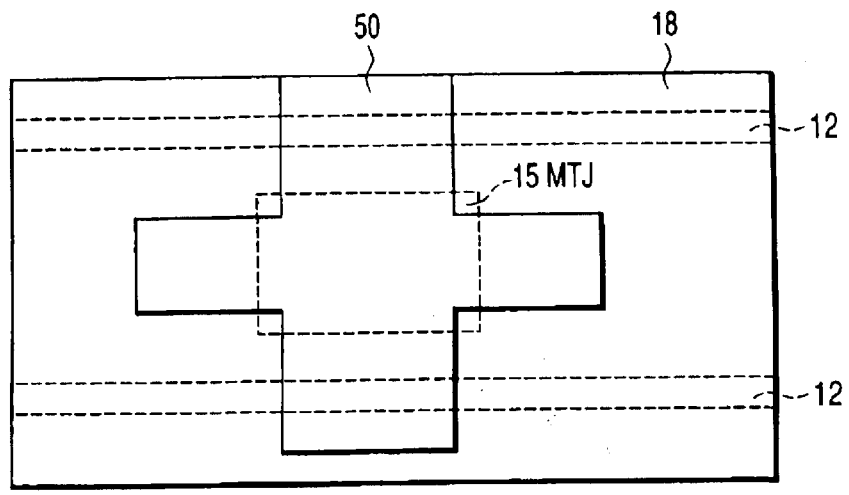
FIG. 35 is a plan view showing a patterned mask in the magnetic memory device according to the 11th embodiment of the present invention.

As shown in FIG. 34, the mask layer 50 is patterned into a cross shape (see FIG. 35), and the magnetic film 18 is processed using the patterned mask layer 50.

Figure 12:
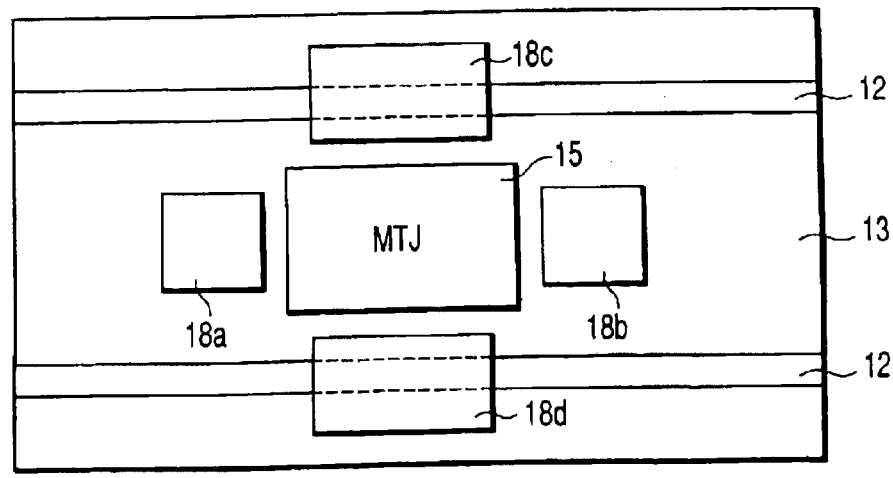
FIG. 12 is a plan view showing the shape of the magnetic film after patterning in the step of FIG. 6 according to the first embodiment of the present invention.

The mask layer 50, magnetic film 18, and insulating film 17, part of the upper metal layer 16 on the MTJ element 15 are removed by etch-back, CMP, or the like. As a result, as shown in FIGS. 6 and 12, first, second, third, and fourth yoke tips 18a, 11b, 18c, and 18d are formed in self-alignment at an interval from the MTJ element 15 by the film thickness of the insulating film 17. Thereafter, the same steps as those in the first embodiment are executed.

The 11th embodiment can obtain the same effects as those of the first embodiment.

12th Embodiment

In the magnetic memory device manufacturing method of the first embodiment, the outer surface of a yoke tip is patterned, and then its inner surface is patterned. In the 12th embodiment, the inner surface of the yoke tip is patterned, and then its outer surface is patterned.

Figure 36:
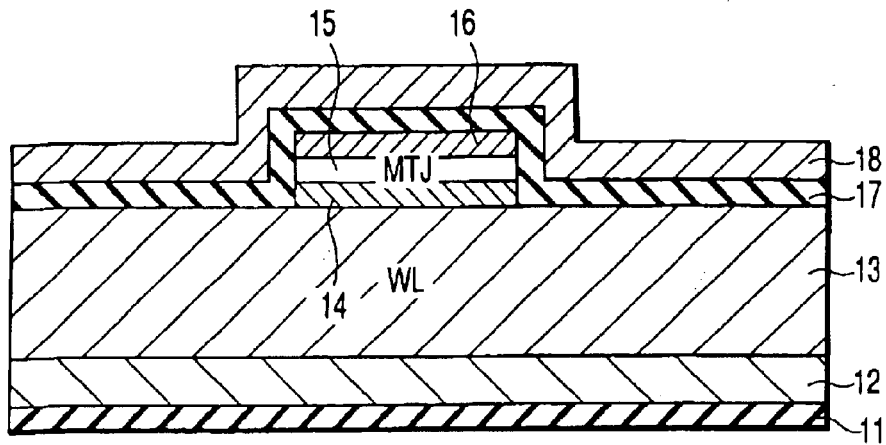
FIG. 36 is a sectional view showing the step subsequent to FIG. 3 in manufacturing a magnetic memory device according to the 12th embodiment of the present invention.
Figure 37:
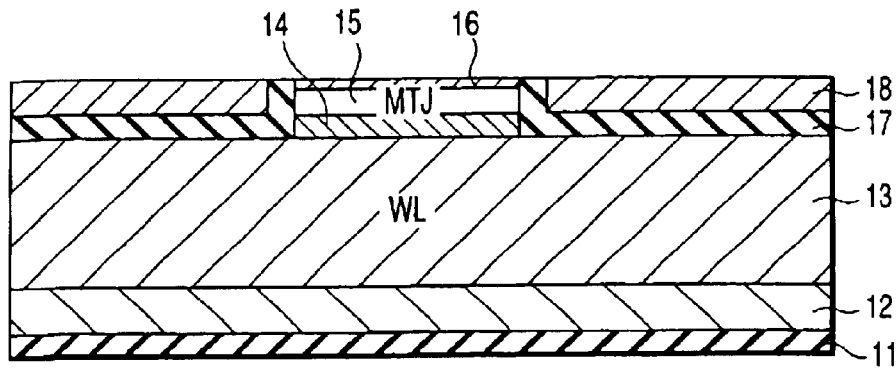
FIG. 37 is a sectional view showing the step subsequent to FIG. 36 in manufacturing the magnetic memory device according to the 12th embodiment of the present invention.
Figure 38:
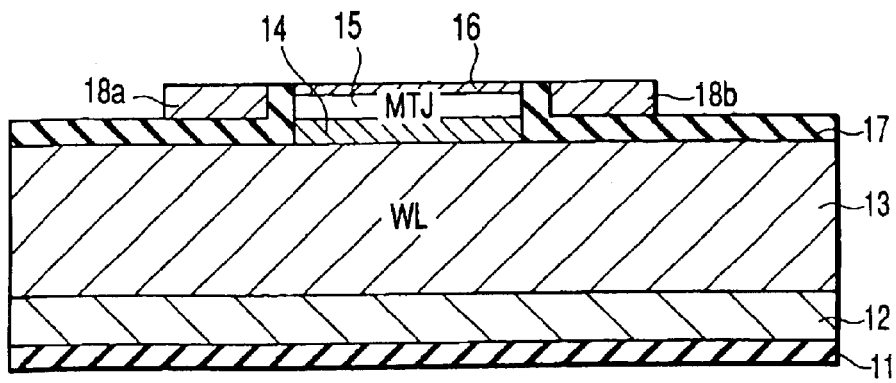
FIG. 38 is a sectional view showing the step subsequent to FIG. 37 in manufacturing the magnetic memory device according to the 12th embodiment of the present invention.

FIGS. 36 to 38 are sectional views showing the steps in manufacturing a magnetic memory device according to the 12th embodiment of the present invention. The magnetic memory device manufacturing method according to the 12th embodiment will be explained. In the 12th embodiment, a description of the same steps as those in the magnetic memory device manufacturing method according to the first embodiment will be simplified.

As shown in FIG. 36, similar to the first embodiment, an MTJ element 15 sandwiched between lower and upper metal layers 14 and 16 is formed on a word line 13. After that, an insulating film 17 and magnetic film 18 are sequentially formed.

As shown in FIG. 37, the magnetic film 18, insulating film 17, and part of the upper metal layer 16 on the MTJ element 15 are removed by etch-back, CMP, or the like.

As shown in FIG. 38, the magnetic film 18 is patterned. Consequently, first, second, third, and fourth yoke tips 18a, 18b, 18c, and 18d are formed in self-alignment at an interval from the MTJ element 15 by the film thickness of the insulating film 17 (see FIG. 12). Thereafter, the same steps as those in the first embodiment are performed.

The 12th embodiment can obtain the same effects as those of the first embodiment.

In the 12th embodiment, compared to the process of the first embodiment, the step on the substrate can be downsized during the process, improving the process controllability. More specifically, in the step of FIG. 37, the controllability of the remaining film thickness of the upper metal layer 16 can be improved. In the step of FIG. 38, the processing precision of the outer edges of the yoke tips 18a and 18b can be increased.

13th Embodiment

In the first embodiment, all the first distances P1, P2, P3, and P4 are almost the same. In the 13th embodiment, P1 and P2 are shorter than P3 and P4.

Figure 41:
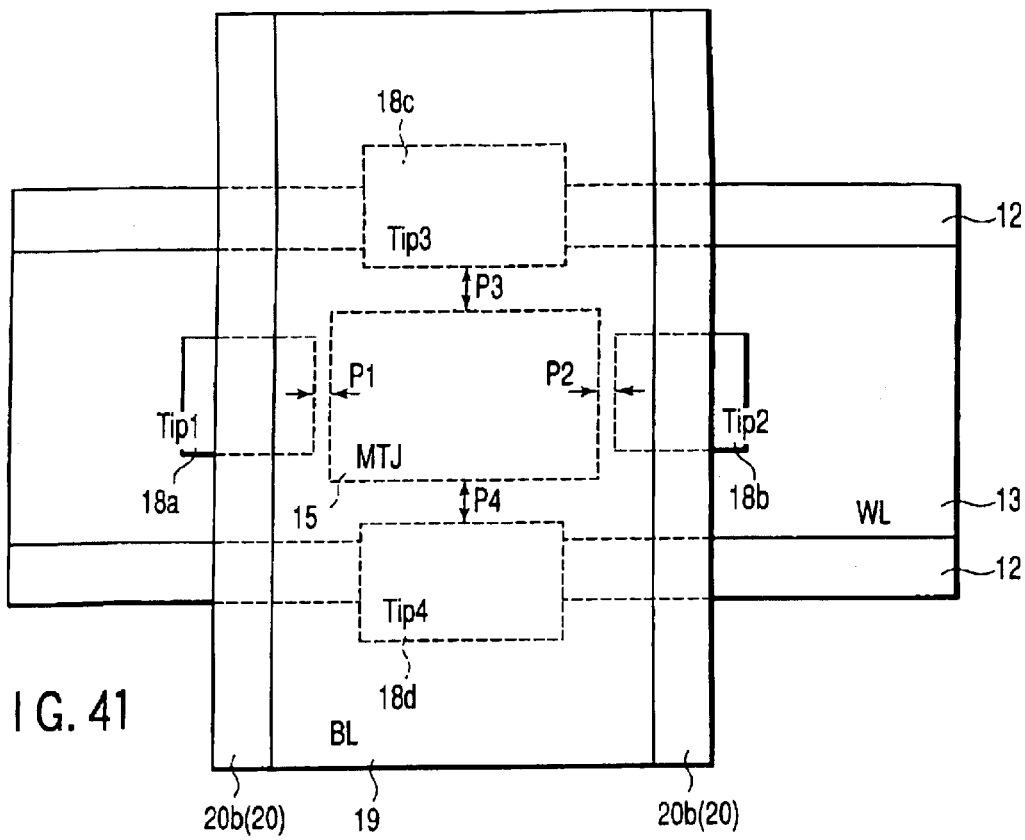
FIG. 41 is a plan view showing a magnetic memory device according to the 13th embodiment of the present invention.

FIG. 41 is a plan view showing a magnetic memory device according to the 13th embodiment of the present invention. As shown in FIG. 41, in the 13th embodiment, first and second yoke tips 18a and 18b on two sides of an MTJ element 15 in the long direction are arranged closer to the MTJ element 15 than third and fourth yoke tips 18c and 18d on two sides of the MTJ element 15 in a direction perpendicular to the long direction. That is, the structure meets inequality (2):

$$P1, P2 < P3, P4 \quad (2)$$

In this case, P1 and P2 may be equal to or different from each other, and P3 and P4 may also be equal to or different from each other.

This structure is formed by, e.g., the following method. In the step of forming an insulating film 17 shown in FIG. 4, the substrate is moved in a direction in which a bit line 19 runs (direction perpendicular to the long direction of the MTJ element 15) when the insulating film 17 is formed by sputtering. This makes it difficult to deposit the insulating film 17 on side surfaces of the MTJ element 15 facing the first and second yoke tips 18a and 18b in comparison with side surfaces of the MTJ element 15 facing the third and fourth yoke tips 18c and 18d. This sputtering can adjust the film thickness of the insulating film 17 such that film thicknesses corresponding to P1 and P2 become smaller than those corresponding to P3 and P4.

The 13th embodiment can achieve the same effects as those of the first embodiment.

In the 13th embodiment, stronger magnetic anisotropy can be ensured in the long direction of the MTJ element 15. Formation of the yoke tip can prevent a decrease in thermal agitation resistance.

As a means for obtaining the same effects as those of the 13th embodiment, the following method can also be adopted. For example, the aspect ratios of the first and second yoke tips 18a and 18b are set lower than those of the third and fourth yoke tips 18c and 18d. For example, the first and second yoke tips 18a and 11b have a square shape, and the third and fourth yoke tips 18c and 18d have a rectangular shape elongated in the long direction of the MTJ element 15.

14th Embodiment

In the first embodiment, all the distances Q1, Q2, Q3, and Q4 are almost the same. In the 14th embodiment, Q1 and Q2 are shorter than Q3 and Q4.

Figure 42:
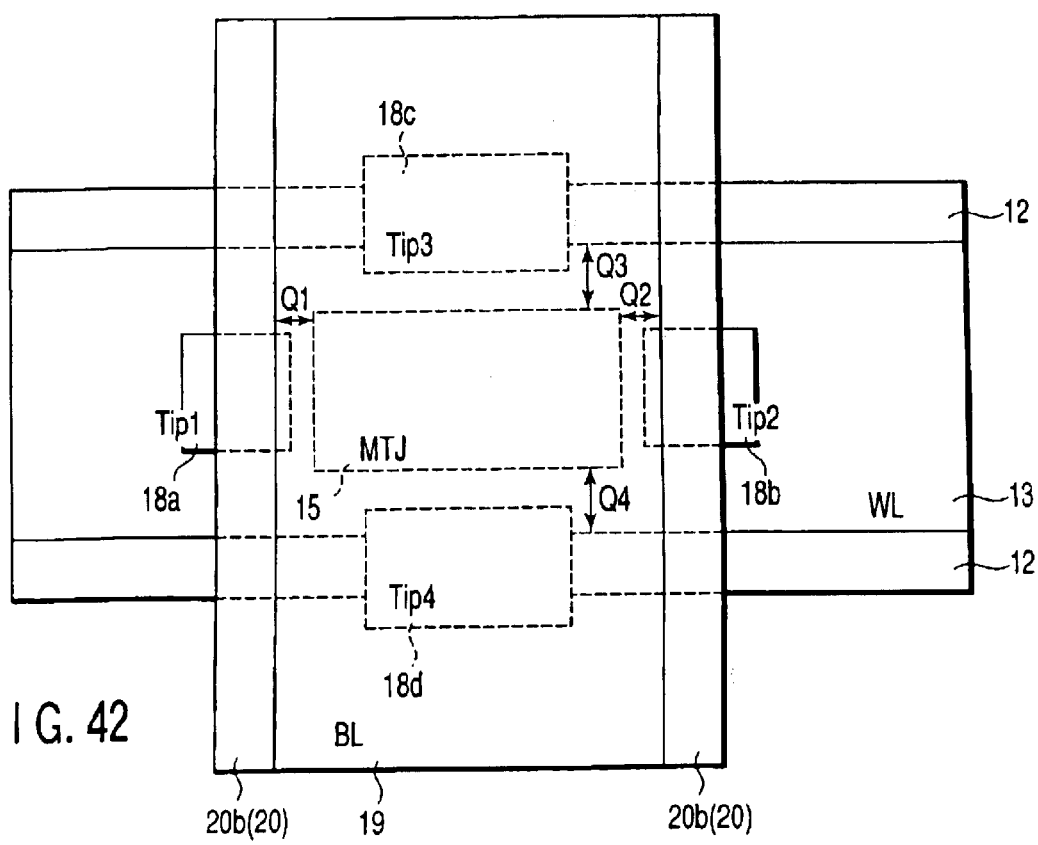
FIG. 42 is a plan view showing a magnetic memory device according to the 14th embodiment of the present invention.

FIG. 42 is a plan view showing a magnetic memory device according to the 14th embodiment of the present invention. As shown in FIG. 42, in the 14th embodiment, second yoke main bodies 20b on two sides of an MTJ element 15 in the long direction are arranged closer to the MTJ element 15 than first yoke main bodies 12 on the two sides of the MTJ element 15 in a direction perpendicular to the long direction. That is, the structure meets inequality (3):

$$Q1, Q2 < Q3, Q4 \quad (3)$$

In this case, Q1 and Q2 may be equal to or different from each other, and Q3 and Q4 may also be equal to or different from each other.

The 14th embodiment can achieve the same effects as those of the first embodiment.

In the 14th embodiment, similar to the 13th embodiment, stronger magnetic anisotropy can be ensured in the long direction of the MTJ element 15. Formation of the yoke tip can prevent a decrease in thermal agitation resistance.

15th Embodiment

In the 15th embodiment, the first to fourth yoke tips are not separated.

FIG. 43 is a plan view showing a magnetic memory device according to the 15th embodiment of the present invention. As shown in FIG. 43, in the 15th embodiment, a yoke tip 18' (hatched portion) is continuously formed around an MTJ element 15.

In this case, first portions of the yoke tip 18' on two sides of the MTJ element 15 in the long direction are magnetically coupled to second yoke main bodies 20. Second portions of the yoke tip 18' on two sides of the MTJ element 15 in a direction perpendicular to the long direction are magnetically coupled to first yoke main bodies 12.

This structure is formed by, e.g., the following method. As shown in FIG. 4, a magnetic film 18 of NiFe or the like is formed on an insulating film 17. As shown in FIG. 5, the outer surface of the magnetic film 18 is patterned into a desired shape. At this time, the magnetic film 18 is patterned into a rectangular shape as shown in FIG. 44 by using an etching mask made of a resist, Ta, or the like. The magnetic film 18, insulating film 17, and part of an upper metal layer 16 on the MTJ element 15 are removed by etch-back, CMP, or the like. As a result, as shown in FIG. 43, the yoke tip 18' is formed around the MTJ element 15 in self-alignment at an interval from the MTJ element 15 by the film thickness of the insulating film 17.

The 15th embodiment can achieve the same effects as those of the first embodiment.

The 15th embodiment uses a rectangular mask simpler than a cross-shaped mask for patterning the outer surface of the magnetic film 18, which facilitates mask formation. Compared to the first embodiment in which yoke tips are separated from each other, the number of factors against misalignment of the MTJ element 15 and the like can be decreased, and the magnetic film 18 can be easily patterned.

16th Embodiment

In the 16th embodiment, the first to fourth yoke tips are stacked.

FIGS. 45 to 50 are sectional views showing the steps in manufacturing a magnetic memory device according to the 16th embodiment of the present invention. The magnetic memory device manufacturing method according to the 16th embodiment will be explained.

Figure 45:
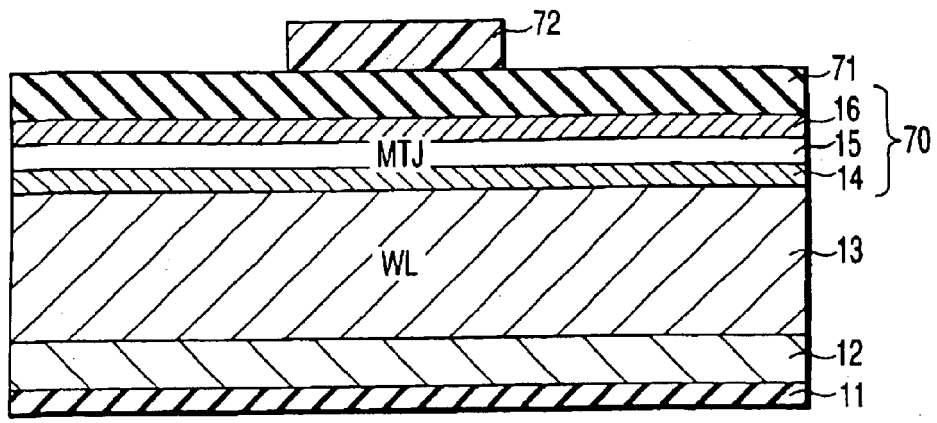

As shown in FIG. 45, a word line 13 covered with a first yoke main body 12 on the lower surface and two side surfaces is formed on an insulating film 11. An MTJ material layer 70 made up of a lower metal layer 14, MTJ element 15, and upper metal layer 16 is formed on the word line 13. A first material layer 71 is formed on the MTJ material layer 70, and a resist 72 is formed on the first material layer 71. Examples of the material of the first material layer 71 are $SiO_x$, $AlO_x$, and $SiN_x$. The resist 72 is then patterned into the shape of the MTJ element 15.

Figure 46:
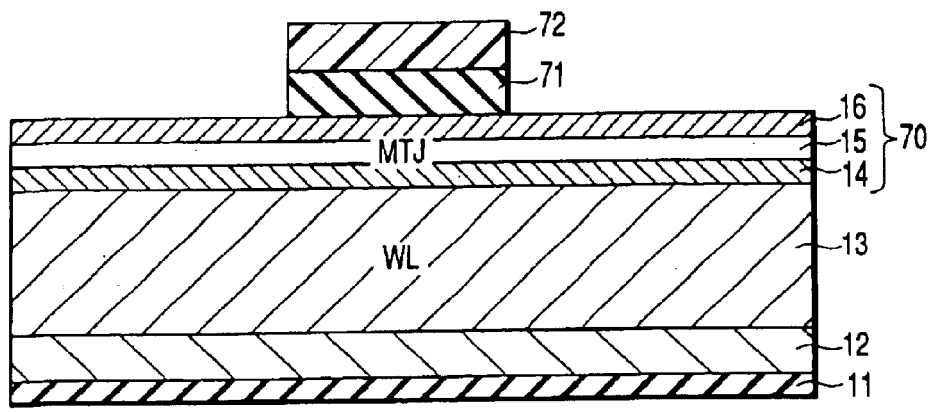

As shown in FIG. 46, the first material layer 71 is selectively etched by RIE or the like using the patterned resist 72 as a mask. Thereafter, the resist 72 is removed.

Figure 47:
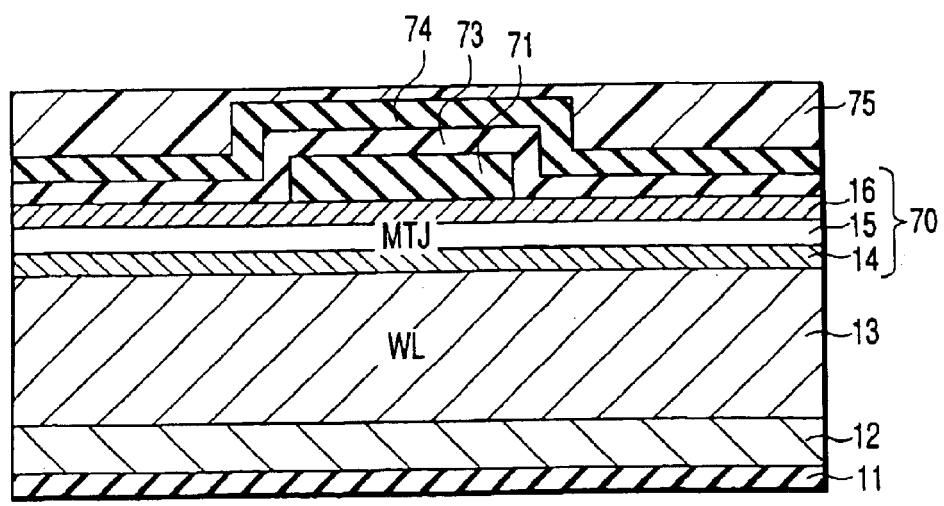
Figure 53:
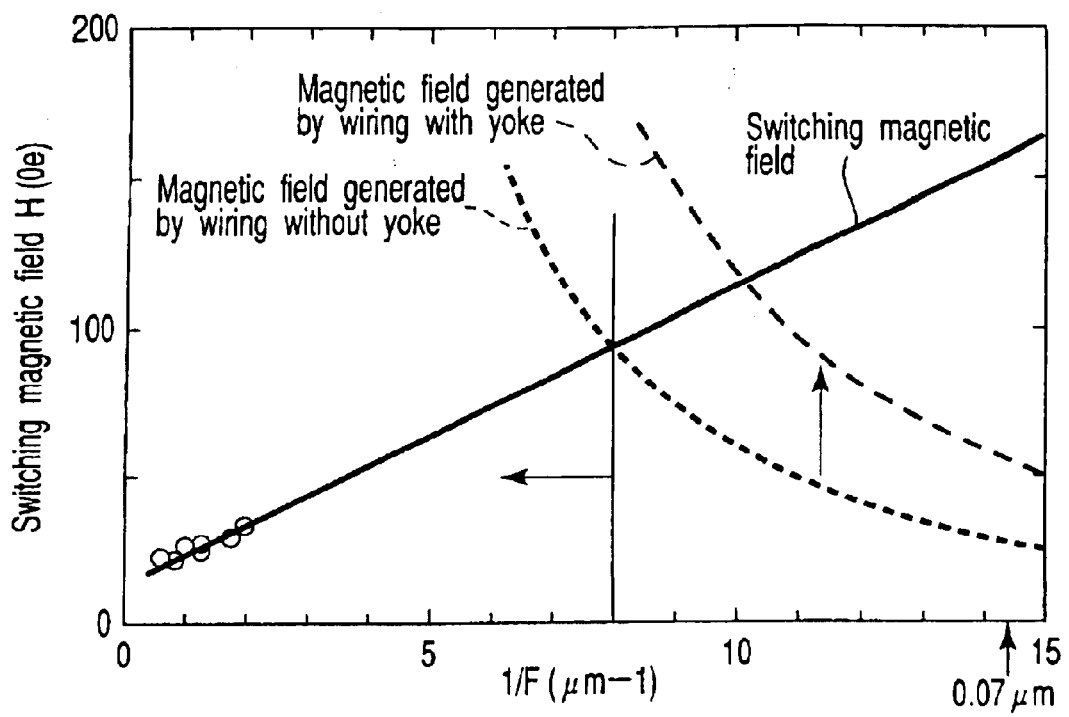
FIG. 53 is a graph showing the switching magnetic field along with miniaturization of the conventional magnetic memory device.

As shown in FIG. 47, a second material layer 73 is formed on the MTJ material layer 70 and first material layer 71, and a third material layer 74 is formed on the second material layer 73. The second material layer 73 is desirably made of a material different from that of the first material layer 71. The third material layer 74 is desirably made of the same material as that of the first material layer 71. This is because the etching selectivity is set higher between the first and third material layers 71 and 74 and the second material layer 73 in consideration of the following step of FIG. 49. For example, the second material layer 73 is made of Si, Al, or Ta, and the third material layer 74 is made of $SiO_x$, $AlO_x$, and $SiN_x$. A resist 75 is formed on the third material layer 74, and planarized by CMP or the like.

As shown in FIG. 48, the resist 75 and the second and third material layers 73 and 74 are planarized by etch-back or CMP, exposing the surface of the first material layer 71.

As shown in FIG. 49, the second material layer 73 exposed between the first and third material layers 71 and 74 is selectively etched by RIE or the like. By selectively etching away only the second material layer 73, a gap can be formed by a film thickness A of the second material layer 73. This method enables patterning at the photolithography resolution limit or lower.

As shown in FIG. 50, the MTJ material layer 70 is etched using the first, second, and third material layers 71, 73, and 74 as a mask. Accordingly, an MTJ s element 15 and yoke tip 18' with the same layered structure are formed.

After that, the gap is filled with an insulating film, and the outer surface of the yoke tip 18' is patterned. A bit line 19 and a second yoke main body 20 which covers the upper and side surfaces of the bit line 19 are formed. Note that the yoke tip 18' may be divided, similar to the first embodiment.

In the magnetic memory device formed by this manufacturing method, the MTJ element 15 and yoke tip 18' are made of the same material and arranged in contact with the word line 13. Similar to the layered structure of the MTJ element 15, the yoke tip 18' may have a layered structure formed from a magnetic layer, as shown in FIGS. 39A, 39B, 40A, and 40B. Also, an anti-ferromagnetic layer may be formed below or on the yoke tip 18'.

The yoke tip 18' is in physical contact with the first yoke main body 12. In order to prevent electrical connection between the bit line 19 and the word line 13, the yoke tip 18' must be electrically insulated from the bit line 19 and second yoke main body 20.

The 16th embodiment can obtain the same effects as those of the first embodiment.

In the 16th embodiment, if the layered structure of the yoke tip 18' is formed by the same material as that of the MTJ element 15, the yoke tip 18' and MTJ element 15 can be simultaneously formed, greatly decreasing the number of steps. If the layered structure of the yoke tip 18' is constituted by stacking a soft magnetic film and anti-ferromagnetic film, the magnetic domain structure becomes a perfect single magnetic domain, and perfect write reproducibility can be realized.

Note that the first and second yoke main bodies 12 and 20 can take a layered structure of magnetic layers, similar to the yoke tip 18' in the 16th embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device manufacturing method, comprising:
    forming a first wiring having at least either of a lower surface and two side surfaces covered with a first yoke main body;
    forming, on the first wiring, a magneto-resistance element sandwiched between first and second layers;
    forming an insulating film on the first wiring and the second layer;
    forming a magnetic film on the insulating film;
    patterning the magnetic film;
    removing part of the second layer, the magnetic film, and the insulating film on the magneto-resistance element to form first to fourth yoke tips from the magnetic film in self-alignment with the magneto-resistance element;
    forming second wiring on the second layer and the first to fourth yoke tips; and
    forming a second yoke main body which covers at least either of an upper surface and two side surfaces of the second wiring.

2. A magnetic memory device manufacturing method, comprising:
    forming a first wiring having at least either of a lower surface and two side surfaces covered with a first yoke main body;
    forming, on the first wiring, a magneto-resistance element sandwiched between first and second layers;
    forming an insulating film on the first wiring and the second layer;
    forming a magnetic film on the insulating film;
    removing part of the second layer, the magnetic film, and the insulating film on the magneto-resistance element;
    patterning the magnetic film to form first to fourth yoke tips from the magnetic film in self-alignment with the magneto-resistance element;
    forming second wiring on the second layer and the first to fourth yoke tips; and
    forming a second yoke main body which covers at least either of an upper surface and two side surfaces of the second wiring.

3. The method according to claim 1, further comprising:
    removing part of the second layer, the magnetic film, and the insulating film on the magneto-resistance element using either of etch-back and CMP.

4. The method according to claim 1, further comprising:
    removing part of the second layer, the magnetic film, and the insulating film on the magneto-resistance element until surfaces of the second layer, the insulating layer, and the magnetic layer become flat.

5. The method according to claim 1, further comprising:
    leaving a step portion on a surface of the magnetic film when part of the second layer, the magnetic film, and the insulating film on the magneto-resistance element are removed.

6. The method according to claim 1, further comprising:
    forming a mask layer after forming the magnetic film on the insulating film;
    patterning the mask layer; and
    patterning the magnetic layer using the patterned mask layer.

7. The method according to claim 1, further comprising:
    forming the first and second yoke tips to contact the second yoke main body and be spaced apart from the first yoke main body.

8. The method according to claim 1, further comprising:
    forming the first and second yoke tips to be magnetically coupled to the second yoke main body.

9. The method according to claim 1, further comprising:
    forming the third and fourth yoke tips to contact the first yoke main body and be spaced apart from the second yoke main body.

10. The method according to claim 1, further comprising:
    forming the third and fourth yoke tips to be magnetically coupled to the first yoke main body.

11. The method according to claim 1, further comprising:
    patterning the magnetic film to separate the first to fourth yoke tips from each other.

12. The method according to claim 1, further comprising:
    forming the first to fourth yoke tips to make distances between the first to fourth yoke tips and the magneto-resistance element equal to distances between the first to fourth yoke tips and the first wiring.

13. The method according to claim 1, further comprising:
    forming the first to fourth yoke tips to make distances between the first to fourth yoke tips and the magneto-resistance element equal to each other.

14. The method according to claim 1, further comprising:
    forming the first to fourth yoke tips to make a distance between the magneto-resistance element and the first yoke main body equal to a distance between the magneto-resistance element and the second yoke main body.

15. The method according to claim 1, wherein the magneto-resistance element includes an MTJ element formed from a first magnetic layer, a second magnetic layer, and a nonmagnetic layer sandwiched between the first and second magnetic layers.

16. The method according to claim 1, further comprising, when the first and second yoke tips are formed on two sides of a long direction of the magneto-resistance element:

forming the first to fourth yoke tips to make distances between the first and second yoke tips and the magneto-resistance element shorter than distances between the third and fourth yoke tips and the magneto-resistance element.

17. The method according to claim 1, further comprising, when the first and second yoke tips are formed on two sides of a long direction of the magneto-resistance element:

making a film thickness of the insulating film on side surfaces of the magneto-resistance element facing the first and second yoke tips smaller than a film thickness of the insulating film on side surfaces of the magneto-resistance element facing the third and fourth yoke tips by moving a substrate in a direction perpendicular to the long direction when forming the insulating film by sputtering.

18. The method according to claim 1, further comprising, when the first and second yoke tips are formed on two sides of a long direction of the magneto-resistance element:

forming the first to fourth yoke tips to make aspect ratios of the first and second yoke tips lower than aspect ratios of the third and fourth yoke tips.

19. The method according to claim 1, further comprising, when the second yoke main body is formed on two sides of a long direction of the magneto-resistance element:

forming the first and second yoke main bodies to make a distance between the second yoke main body and the magneto-resistance element shorter than a distance between the first yoke main body and the magneto-resistance element.

20. The method according to claim 1, further comprising:

patterning the magnetic film to continuously form the first to fourth yoke tips around the magneto-resistance element.

21. A magnetic memory device manufacturing method, comprising:

forming a first wiring having at least either of a lower surface and two side surfaces covered with a first yoke main body;

forming an element material layer from a magneto-resistance element material sandwiched between first and second layers on the first wiring;

forming a first material layer having a magneto-resistance element shape on the element material layer;

forming a second material layer on the first material layer and the element material layer;

forming a third material layer on the second material layer;

planarizing the second and third material layers until the first material layer is exposed;

removing the second material layer exposed between the first and third material layers to expose the element material layer;

selectively removing the element material layer to form a magneto-resistance element and a yoke tip from the element material layer;

forming second wiring on the magneto-resistance element; and forming a second yoke main body which covers at least either of an upper surface and two side surfaces of the second wiring.

22. The method according to claim 21, further comprising:

forming the first and second yoke main bodies from a layered structure of a magnetic film.

23. The method according to claim 21, further comprising:

forming the first and second material layers are formed from different materials.

24. The method according to claim 21, further comprising:

forming the first and third material layers from a same material.

25. The method according to claim 1, wherein the first and second layers include metal layers.

26. The method according to claim 1, wherein either of the first and second layers includes a diode layer.

* * * * *

UNITED STATES PATENT AND TRADEMARK OFFICE
CERTIFICATE OF CORRECTION

PATENT NO. : 6,797,536 B2
DATED : September 28, 2004
INVENTOR(S) : Yoda et al.

It is certified that error appears in the above-identified patent and that said Letters Patent is hereby corrected as shown below:

<u>Title page, Item [54] and Column 1, line 1,</u>
Title, should read: -- MAGNETIC MEMORY DEVICE HAVING YOKE LAYER, AND MANUFACTURING METHOD THEREOF --

Signed and Sealed this

Seventh Day of December, 2004

JON W. DUDAS
*Director of the United States Patent and Trademark Office*